(12) United States Patent
Lee et al.

(10) Patent No.: US 8,334,562 B2
(45) Date of Patent: Dec. 18, 2012

(54) MEMORY DEVICE AND METHOD OF FABRICATING THE SAME

(75) Inventors: Chang-Hyun Lee, Suwon (KR); Jung-dal Choi, Suwon (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 49 days.

(21) Appl. No.: 12/805,962

(22) Filed: Aug. 26, 2010

(65) Prior Publication Data
US 2010/0327371 A1    Dec. 30, 2010

Related U.S. Application Data

(62) Division of application No. 11/976,389, filed on Oct. 24, 2007, now Pat. No. 7,808,036.

(30) Foreign Application Priority Data

Dec. 7, 2006  (KR) .................. 10-2006-0123972

(51) Int. Cl.
*G11C 16/04* (2006.01)
(52) U.S. Cl. .................... 257/326; 365/185.26
(58) Field of Classification Search .......... 257/326, 257/390, 391, 401, E21.652
See application file for complete search history.

(56) References Cited

U.S. PATENT DOCUMENTS

| | | | |
|---|---|---|---|
| 5,473,563 A | 12/1995 | Suh et al. | |
| 5,546,341 A | 8/1996 | Suh et al. | |
| 5,814,854 A | 9/1998 | Liu et al. | |
| 6,222,224 B1 * | 4/2001 | Shigyo | 257/315 |
| 6,812,521 B1 | 11/2004 | He et al. | |
| 6,858,906 B2 | 2/2005 | Lee et al. | |
| 7,042,770 B2 | 5/2006 | Lee et al. | |
| 7,122,869 B2 | 10/2006 | Yaegashi | |
| 7,227,232 B2 * | 6/2007 | Liou et al. | 257/390 |
| 2003/0117856 A1 | 6/2003 | Lee et al. | |
| 2004/0113199 A1 * | 6/2004 | Hazama et al. | 257/317 |

(Continued)

FOREIGN PATENT DOCUMENTS

JP    07-115177    5/1995

(Continued)

OTHER PUBLICATIONS

"New Nonvolatile Memory With Charge-Trapping Sidewall" Masatoshi Fukuda, Toshiro Nakanishi and Yasuo Nara, Member, IEEE, IEEE Electron Device Letters, vol. 24, No. 8, Jul. 2003 pp. 490-492.

(Continued)

*Primary Examiner* — Jenny L Wagner
*Assistant Examiner* — Mark Tornow
(74) *Attorney, Agent, or Firm* — Harness, Dickey & Pierce, P.L.C.

(57) ABSTRACT

A nonvolatile memory including a plurality of memory transistors in series, wherein source/drain and channel regions therebetween are of a first type and a select transistor, at each end of the plurality of memory transistors in series, wherein channels regions of each of the select transistors is of the first type. The first type may be n-type or p-type. The nonvolatile memory may further include a first dummy select transistor at one end of the plurality of memory transistors in series between one of the select transistors and the plurality of memory transistors in series and a second dummy select transistor at the other end of the plurality of memory transistors in series between the other select transistor and the plurality of memory transistors in series.

20 Claims, 37 Drawing Sheets

U.S. PATENT DOCUMENTS

| | | | |
|---|---|---|---|
| 2004/0152262 A1* | 8/2004 | Ichige et al. | 438/257 |
| 2004/0169238 A1* | 9/2004 | Lee et al. | 257/406 |
| 2005/0104120 A1 | 5/2005 | Ichige et al. | |
| 2006/0049449 A1 | 3/2006 | Iino et al. | |
| 2006/0180851 A1 | 8/2006 | Lee et al. | |
| 2008/0067517 A1 | 3/2008 | Jang et al. | |

FOREIGN PATENT DOCUMENTS

| | | |
|---|---|---|
| JP | 2006-294940 | 10/2006 |
| KR | 10-0195198 | 2/1999 |
| KR | 10-2003-055871 | 7/2003 |
| KR | 10-2004-0079057 | 9/2004 |
| KR | 10-2005-0078251 | 8/2005 |

OTHER PUBLICATIONS

"Characteristics of MOSFET with Non-Overlapped Source-Drain to Gate Region" Hyunjin Lee, Sung-il Chang, Jongho Lee and Hyungcheol Shin, Proc. $23^{rd}$ International Conference on Microelectronics (MIEL 2002), vol. 2, NIS, Yugoslavia May 12-15, 2000, pp. 439-441.

* cited by examiner

|  | Selected WL | Unselected WL | SSL | GSL | CSL | Selected BL | Unselected BL | substrate |
|---|---|---|---|---|---|---|---|---|
| Program | Vpgm (15~20V) | Vpass (~10V) | Vcc | 0V | 0V | 0V | Vcc | 0V |
| read | Vsel | Vr_pass (4.5~5V) | Vr_pass | Vr_pass | 0V | 1~2V | 0V | 0V |
| Erase (block) | 0V | 0V | Floating | Floating | Floating | Floating | Floating | 21V |

MEMORY DEVICE AND METHOD OF FABRICATING THE SAME

PRIORITY STATEMENT

This application is a divisional of U.S. application Ser. No. 11/976,389, filed Oct. 24, 2007 now U.S. Pat. No. 7,808,036, which claims priority under 35 U.S.C. §119 to Korean Patent Application No. 10-2006-0123972 filed on Dec. 7, 2006, the contents of each of which are herein incorporated by reference in their entirety for all purposes.

BACKGROUND

1. Field

Example embodiments relate to a storage device, for example, to a device and a method for manufacturing a non-volatile and electrically erasable semiconductor memory device, for example, a flash memory.

2. Description of the Related Art

Non-volatile memory retains information stored in its memory cells even when no power is supplied. Examples include mask ROM, EPROM, and EEPROM.

Non-volatile memory is widely used in various kind of electronic products, for example, personal computers, personal digital assistants (PDAs), cellular phones, digital still cameras, digital video cameras, video game players, memory cards, and other electronic devices.

Memory cards types may include multimedia cards (MMC), secure digital (SD) cards, compact flash cards, memory sticks, smart media cards, and extreme digital (xD) picture cards.

Among non-volatile memory devices, a flash memory is widely used. Flash memory may be divided into a Not-OR (NOR) type and a Not-AND (NAND) type based on a connection structure of cells and bit lines. Because a read speed is faster and a write operation is slower, a NOR-type flash memory may be used as a code memory. Because a write speed is faster and a price per unit area is lower, a NAND-type flash memory may be used as a mass storage device.

NOR-type flash memory may be used in BIOS/networking in a PC, a router, or a hub or in a telecommunications switcher. NOR-type flash memory may also be used to store code or data for cellular phones, personal digital assistants (PDAs), POS, or PCA.

NAND-type flash memory may be used in memory cards for mobile computers, digital cameras, both still and moving, near-CD quality voice and audio recorders, rugged and reliable storage, for example, solid-state disks.

The programming method for NOR-type flash memory is hot carrier injection and the programming method for NAND-type flash memory is Fowler-Nordheim (FN) tunneling.

Advances in consumer electronics cause demand for higher density memory devices. Efforts to manufacture devices meeting this demand often involve scaling down the sizes of gate structures and reducing or minimizing the space between adjacent gate structures.

With the reduction in channel length of transistors, the influence of a source and drain upon an electric field or potential in the channel region may increase. This is referred to as the 'short channel effect'.

The short channel effect may become especially serious as the gate length of transistors approaches several tens of nanometers. In these cases, variations in threshold voltages may result.

To overcome the short channel effect, halo junction structures has been proposed. However, this approach may reduce on-current and/or increasing leakage current.

Therefore, the halo junction structure may not be suitable for handling short channel effect in sub-nano scaled NAND flash memory devices.

As mentioned above, another related problem is leakage current, for example, trap-assisted leakage current. As shown in FIG. 41, in a conventional charge trap memory device 10, including a substrate 12, a tunnel insulating pattern 14, a charge storage pattern 16, a blocking insulating pattern 18, and a conductive pattern 20, electrons e$^-$ may leak from the charge storage pattern 16 through blocking insulating pattern 18 to the conductive pattern 20, for example, as a result of one or more defects D in the blocking insulating layer.

Conventional art publications have studied the characteristics of non-overlapped MOSFETs, and reported that performance degradation was suppressed by using a short non-overlap distance, for example, less than 10 nm. These results indicate that a non-overlapped structure is practically applicable.

Referring now to a conventional device from U.S. patent application Ser. No. 11/643,022, filed on Nov. 20, 2006, the entire contents of which are hereby incorporated by reference in their entirety, shown in FIG. 42, a memory may include a substrate 10, a channel region 40cC, a fringing field 90, an inversion layer 410, and an inversion layer at a source/drain region 430. As shown, a pass voltage of 5 V may be applied to memory transistors $MT_{n-1}$ and $MT_{n+1}$, and a select voltage Vsel may be applied to memory transistors $MT_n$. The fringing field 90 from the cell gate potential may cause source/drain inversion, which enables the channel region to conduct a charge.

SUMMARY

Example embodiments improve or maximize device performance. Example embodiments may overcome the 'short channel effect' and/or trap-assisted leakage current.

Example embodiments are directed to a nonvolatile memory, including a plurality of memory transistors in series, wherein source/drain and channel regions therebetween are of a first type and a select transistor, at each end of the plurality of memory transistors in series, wherein channels regions of each of the select transistors is of the first type.

In example embodiments, the source/drain region between each of the select transistors and end transistors of the plurality of memory transistors in series is of the first type.

In example embodiments, a doping concentration of the source/drain regions between the plurality of memory transistors in series is less than a doping concentration of the channel regions of the plurality of memory transistors.

In example embodiments, a doping concentration of the source/drain regions and the channel regions between the plurality of memory transistors in series is less than a doping concentration of the channel regions of the select transistors.

In example embodiments, one select transistor is a string select transistor and the other select transistor is a ground select transistor.

In example embodiments, an absolute threshold voltage of the plurality of memory transistors is lower than an absolute threshold voltage of each of the select transistors.

In example embodiments, the first type is p-type.

In example embodiments, the nonvolatile memory may further include a first dummy select transistor at one end of the plurality of memory transistors in series between one of the select transistors and the plurality of memory transistors in series and a second dummy select transistor at the other end of the plurality of memory transistors in series between the other select transistor and the plurality of memory transistors in series.

In example embodiments, the source/drain region between one of the select transistors and the first dummy select transistor and the source/drain region between the other select transistors and the second dummy select transistor is p-type.

In example embodiments, the source/drain region between one of the select transistors and the first dummy select transistor and the source/drain region between the other select transistors and the second dummy select transistor is n-type.

In example embodiments, the source/drain region between each of the select transistors and end transistors of the plurality of memory transistors in series is of a second type.

In example embodiments, the first type is p-type and the second type is n-type.

In example embodiments, the nonvolatile memory may further include a first dummy select transistor at one end of the plurality of memory transistors in series between one of the select transistors and the plurality of memory transistors in series and a second dummy select transistor at the other end of the plurality of memory transistors in series between the other select transistor and the plurality of memory transistors in series.

In example embodiments, the source/drain region between one of the select transistors and the first dummy select transistor and the source/drain region between the other select transistors and the second dummy select transistor is p-type.

In example embodiments, the source/drain region between one of the select transistors and the first dummy select transistor and the source/drain region between the other select transistors and the second dummy select transistor is n-type.

In example embodiments, a stacked nonvolatile memory structure may include a plurality of vertically stacked memories and an insulator between each of the plurality of vertically stacked memories.

In example embodiments, a system may further include an interface for receiving data for the system and sending data external to the system, an I/O device for receiving input data from a user and outputting output data to the data, a controller for controlling operation of the system, a nonvolatile memory, storing commends executed by the controller, and a bus facilitating data transfer between the interface, the I/O device, the controller, and the nonvolatile memory.

Example embodiments are directed to a nonvolatile memory including a plurality of memory transistors in series, wherein source/drain and channel regions therebetween are of n-type and at least one select transistor, at each end of the plurality of memory transistors in series, wherein channels regions of each of the at least one select transistors is of p-type.

In example embodiments, the source/drain region between each of the at least one select transistors and end transistors of the plurality of memory transistors in series is of n-type.

In example embodiments, a doping concentration of the source/drain regions between the plurality of memory transistors in series is less than a doping concentration of the channel regions of the plurality of memory transistors.

In example embodiments, a doping concentration of the source/drain regions and the channel regions between the plurality of memory transistors in series is less than a doping concentration of the channel regions of the select transistors.

In example embodiments, one select transistor is a string select transistor and the other select transistor is a ground select transistor.

In example embodiments, an absolute threshold voltage of the plurality of memory transistors is lower than an absolute threshold voltage of each of the select transistors.

In example embodiments, the nonvolatile memory may further include a first dummy select transistor at one end of the plurality of memory transistors in series between one of the select transistors and the plurality of memory transistors in series and a second dummy select transistor at the other end of the plurality of memory transistors in series between the other select transistor and the plurality of memory transistors in series.

In example embodiments, the source/drain region between one of the select transistors and the first dummy select transistor and the source/drain region between the other select transistors and the second dummy select transistor is p-type.

In example embodiments, the source/drain region between one of the select transistors and the first dummy select transistor and the source/drain region between the other select transistors and the second dummy select transistor is n-type.

In example embodiments, a stacked nonvolatile memory structure may include a plurality of vertically stacked memories and an insulator between each of the plurality of vertically stacked memories.

In example embodiments, a system may further include an interface for receiving data for the system and sending data external to the system, an I/O device for receiving input data from a user and outputting output data to the data, a controller for controlling operation of the system, a nonvolatile memory, storing commends executed by the controller, and a bus facilitating data transfer between the interface, the I/O device, the controller, and the nonvolatile memory.

Example embodiments are directed to a method of manufacturing a nonvolatile memory including forming source/drain and channel regions of a plurality of memory transistors in series, of a first type and forming channels regions of a select transistor at each end of the plurality of memory transistors in series, of the first type.

In example embodiments, the method may further include forming the source/drain region between each of the select transistors and end transistors of the plurality of memory transistors in series of the first type.

In example embodiments, the first type is p-type.

In example embodiments, the method may further include forming a first dummy select transistor at one end of the plurality of memory transistors in series between one of the select transistors and the plurality of memory transistors in series and forming a second dummy select transistor at the other end of the plurality of memory transistors in series between the other select transistor and the plurality of memory transistors in series.

In example embodiments, the method may further include forming the source/drain region between one of the select transistors and the first dummy select transistor and the source/drain region between the other select transistors and the second dummy select transistor of p-type.

In example embodiments, the method may further include forming the source/drain region between one of the select transistors and the first dummy select transistor and the source/drain region between the other select transistors and the second dummy select transistor of n-type.

In example embodiments, the method may further include forming the source/drain region between each of the select transistors and end transistors of the plurality of memory transistors in series of a second type.

In example embodiments, the first type is p-type and the second type is n-type.

In example embodiments, the method may further include forming a first dummy select transistor at one end of the plurality of memory transistors in series between one of the select transistors and the plurality of memory transistors in series and forming a second dummy select transistor at the other end of the plurality of memory transistors in series between the other select transistor and the plurality of memory transistors in series.

In example embodiments, the method may further include forming the source/drain region between one of the select transistors and the first dummy select transistor and the source/drain region between the other select transistors and the second dummy select transistor is p-type.

In example embodiments, the method may further include forming the source/drain region between one of the select transistors and the first dummy select transistor and the source/drain region between the other select transistors and the second dummy select transistor is n-type.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
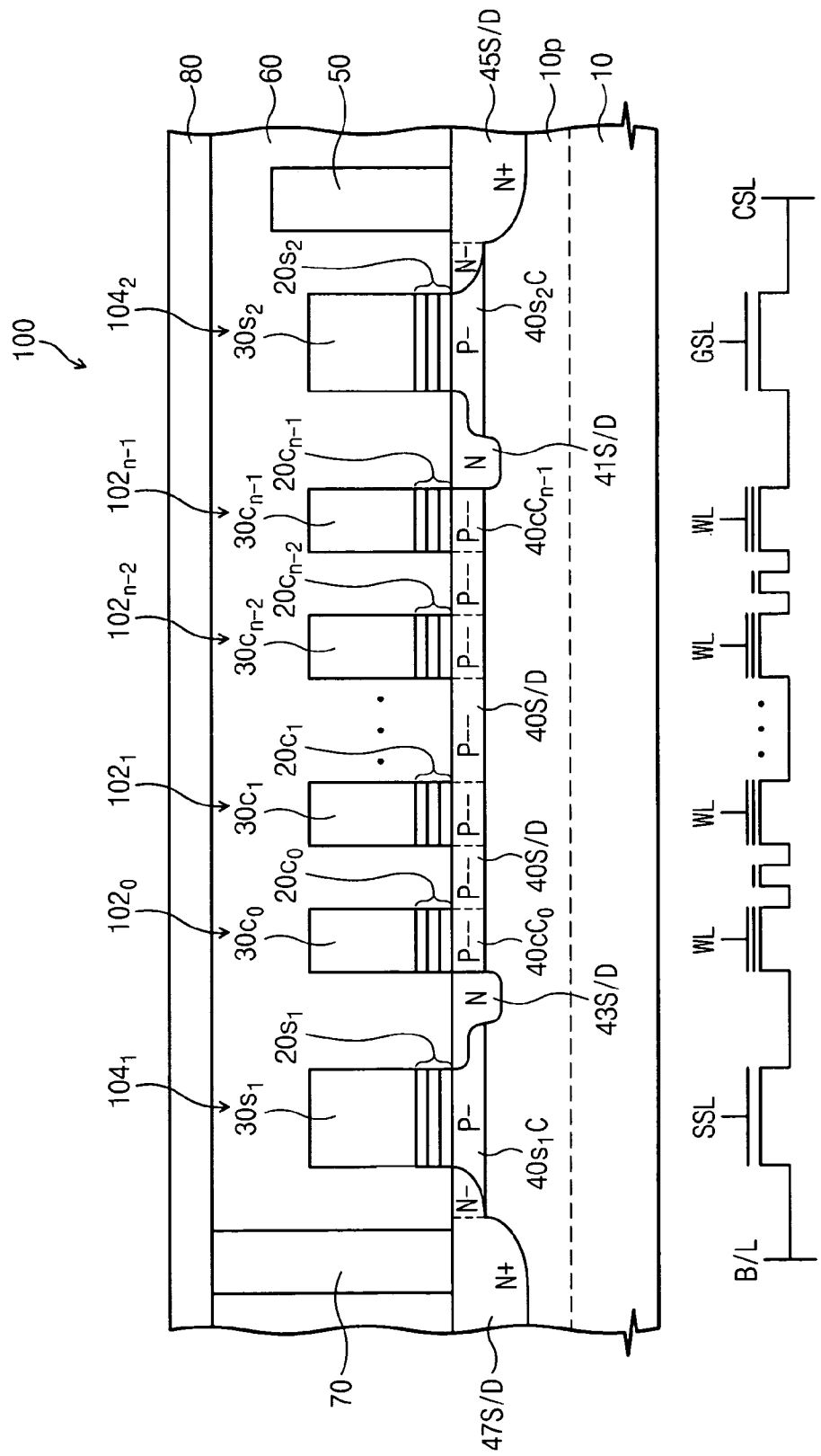
FIG. 1 illustrates a non-volatile memory in accordance with example embodiments.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

FIG. 1 illustrates a non-volatile memory in accordance with example embodiments. As illustrated in FIG. 1, non-volatile memory 100 may include a substrate 10 and a well region 10$p$. The non-volatile memory 100 may further include a plurality of memory transistors $102_0$-$102_{n-1}$ in series and a select transistor $104_1$, $104_2$, at each end of the plurality of memory transistors $102_0$-$102_{n-1}$ in series.

Each of the plurality of memory transistors $102_0$-$102_{n-1}$ in series may include a memory pattern $20c_0$-$20c_{n-1}$, a cell gate $30c_0$-$30c_{n-1}$, and a channel region $40c_0$-$40c_{n-1}$. Each of the select transistors $104_1$, $104_2$ may include gate insulating patterns $20s_1$, $20s_2$. One of the select transistors $104_1$ may act as a string select transistor and include a string select gate $30s_1$ and a channel region $40s_1C$. The other of the select transistors $104_2$ may act as a ground select transistor and include a ground select gate $30s_2$ and a channel region $40s_2C$.

The non-volatile memory 100 may further include source/drain regions 40S/D between the plurality of memory transistors $102_0$-$102_{n-1}$ in series, a source/drain region 41S/D between the ground select transistor $104_2$ and the memory transistor $102_{n-1}$, a source/drain region 43S/D between the string select transistor $104_1$ and the memory transistor $102_{0m}$, a source/drain region 45S/D between the ground select transistor $104_2$ to a common source line (CSL) 50, and a source/drain region 47S/D between the string select transistor $104_1$ and a contact 70, to connect the ground select transistor $104_2$ to a bit line 80. As shown in FIG. 1, the non-volatile memory 100 may further include an inter layer dielectric 60.

As illustrated in FIG. 1, in example embodiments, the source/drain regions 40S/D of the plurality of memory transistors $102_0$-$102_{n-1}$ in series may have the same dopant type as the channel regions $40c_0$-$40c_{n-1}$ of the plurality of memory transistors $102_0$-$102_{n-1}$ in series. As a result, there may be no P/N junction which makes it possible to reduce or remove the leakage current and/or or punch-through from the junction. In example embodiments, the dopant type is p-type.

As illustrated in FIG. 1, in example embodiments, the channel regions $40c_0$-$40c_{n-1}$ of the plurality of memory transistors $102_0$-$102_{n-1}$ in series may have a different doping concentration than the channel regions $40s_1C$, $40s_2C$ of the select transistors $104_1$, $104_2$. As shown in FIG. 1, P- indicates a higher P-type dopant concentration than P--.

In example embodiments, the absolute threshold voltage $V_{TH}$ value of the plurality of memory transistors $102_0$-$102_{n-1}$ in series may be lower than that of the select transistors $104_1$, $104_2$ due to different doping concentrations.

As illustrated in FIG. 1, in example embodiments, the source/drain region 41S/D between the ground select transistor $104_2$ and the memory transistor $102_{n-1}$, may be doped with a dopant opposite from the dopant used for the channel regions $40c_0$-$40c_{n-1}$ of the plurality of memory transistors $102_0$-$102_{n-1}$ and the channel regions $40s_1C$, $40s_2C$ of the select transistors $104_1$, $104_2$. In example embodiments, the dopant of the source/drain region 41S/D may be N-type.

As also illustrated in FIG. 1, in example embodiments, the source/drain region 45S/D and the source/drain region 47S/D may be doped with a dopant different from the dopant used for the channel regions $40c_0$-$40c_{n-1}$ of the plurality of memory transistors $102_0$-$102_{n-1}$ and the channel regions $40s_1C$, $40s_2C$ of the select transistors $104_1$, $104_2$. In example embodiments, the dopant of the source/drain region 45S/D and the source/drain region 47S/D may be N-type. In example embodiments, the dopant concentration of the source/drain region 41S/D, the source/drain region 45S/D, and the source/drain region 47S/D may be the same or different form each other.

In example embodiments, each of the plurality of memory transistors $102_0$-$102n$-1 in series may have more than one data level, in order to store at least two different types of data. In example embodiments, each of the plurality of memory transistors $1020$-$102n$-1 in series may be a multi-level cell (MLC) and be capable of storing N-bit data, where N≧1.

In example embodiments, the gate insulating pattern $20s1$, $20s2$ of the select transistors 1041, 1042 may have the same stacking layer as the gate insulating pattern $20c0$-$20cn$-1 of the each of the plurality of memory transistors $1020$-$102n$-1 in series or a different stacking structure.

In example embodiments, the characteristics of the program disturbance (or inhibition of the boosting efficiency) may be improved in example embodiments, due to lower capacitive coupling between the cell gates $30c0$-$30cn$-1 and the channel regions $40c0$-$40cn$-1 of the plurality of memory transistors $1020$-$102n$-1 in series as a result of a lower dopant level, for example, P-.

In example embodiments, the doping concentrations of the source/drain regions 40S/D may be relatively lower than that of the channel regions $40c0$-$40cn$-1, which makes for easier inversion.

As shown in FIG. 1, the NAND string of FIG. 1 may be formed as a memory array. In other example embodiments, the NAND string may further include a decoder.

As illustrated in FIG. 1, the NAND array may also include a string select line (SSL), wordlines (WL), ground select line (GSL), the common source line (CSL) and bit lines (B/L), which may be extended by the NAND string.

Figure 2:
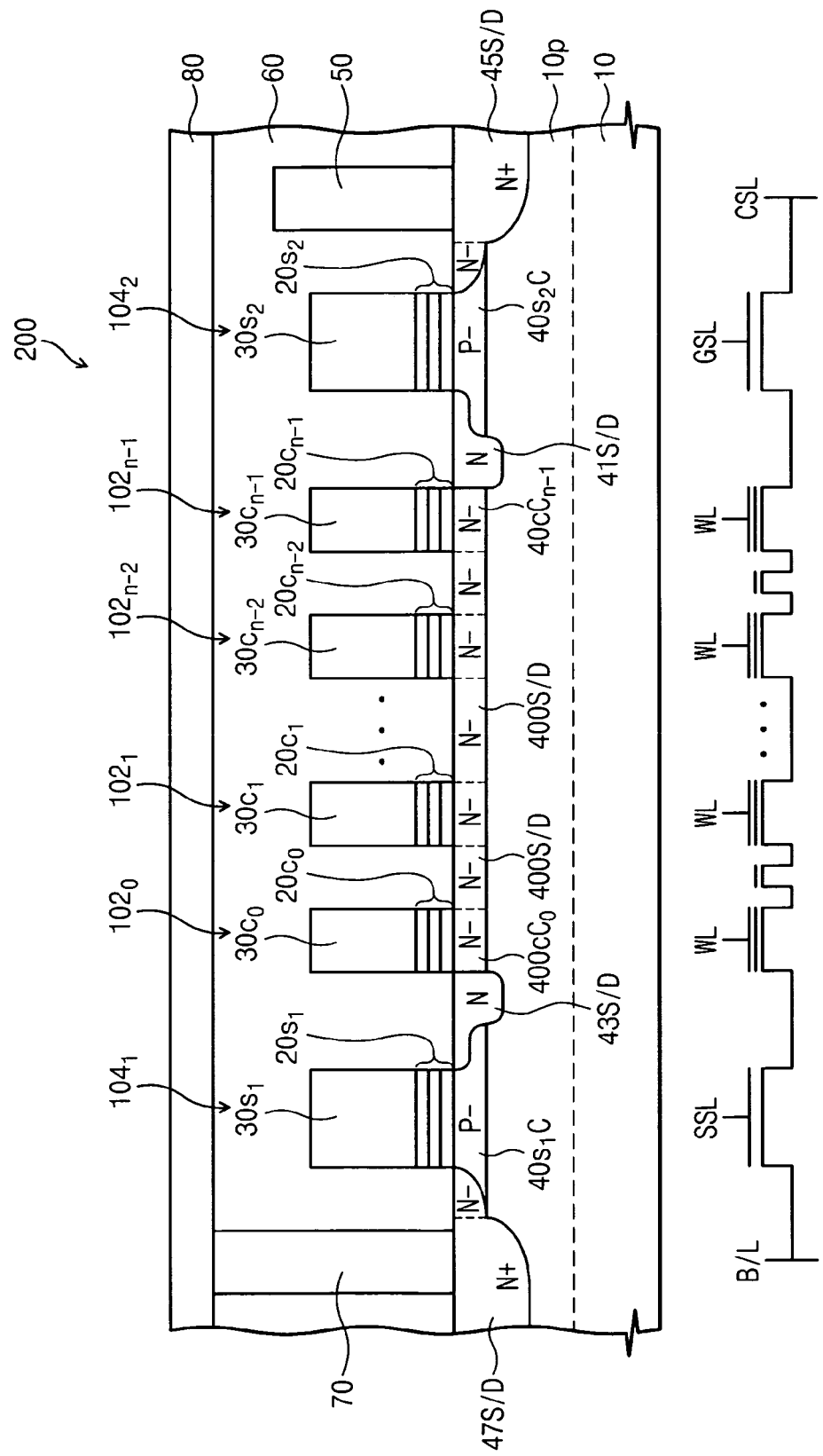
FIG. 2 illustrates a non-volatile memory in accordance with example embodiments.

FIG. 2 illustrates a non-volatile memory 200 in accordance with example embodiments. FIG. 2 is similar to FIG. 1, in that in FIG. 2, each of plurality of memory transistors $1020$-$102n$-1 in series includes a channel region $400c0$-$400cn$-1 and source/drain regions 400S/D having the same dopant type. However, in FIG. 2, the dopant type is N-type.

In example embodiments, the doping concentration of the source/drain region 400S/D of the plurality of memory transistors $1020$-$102n$-1 may be lower than that the concentration of the source/drain region 41S/D and/or 43S/D. In example embodiments, the absolute threshold voltage Vth value of a memory transistor $102n$ may be lower than that of the select transistor 1041, 1042 due to the different doping concentration of each transistor, for example N- vs P-.

Similar to FIG. 1, the NAND array of FIG. 2 may also include a string select line (SSL), wordlines (WL), ground select line (GSL), the common source line (CSL) and bit lines (B/L), which may be extended by the NAND string.

Figure 3:
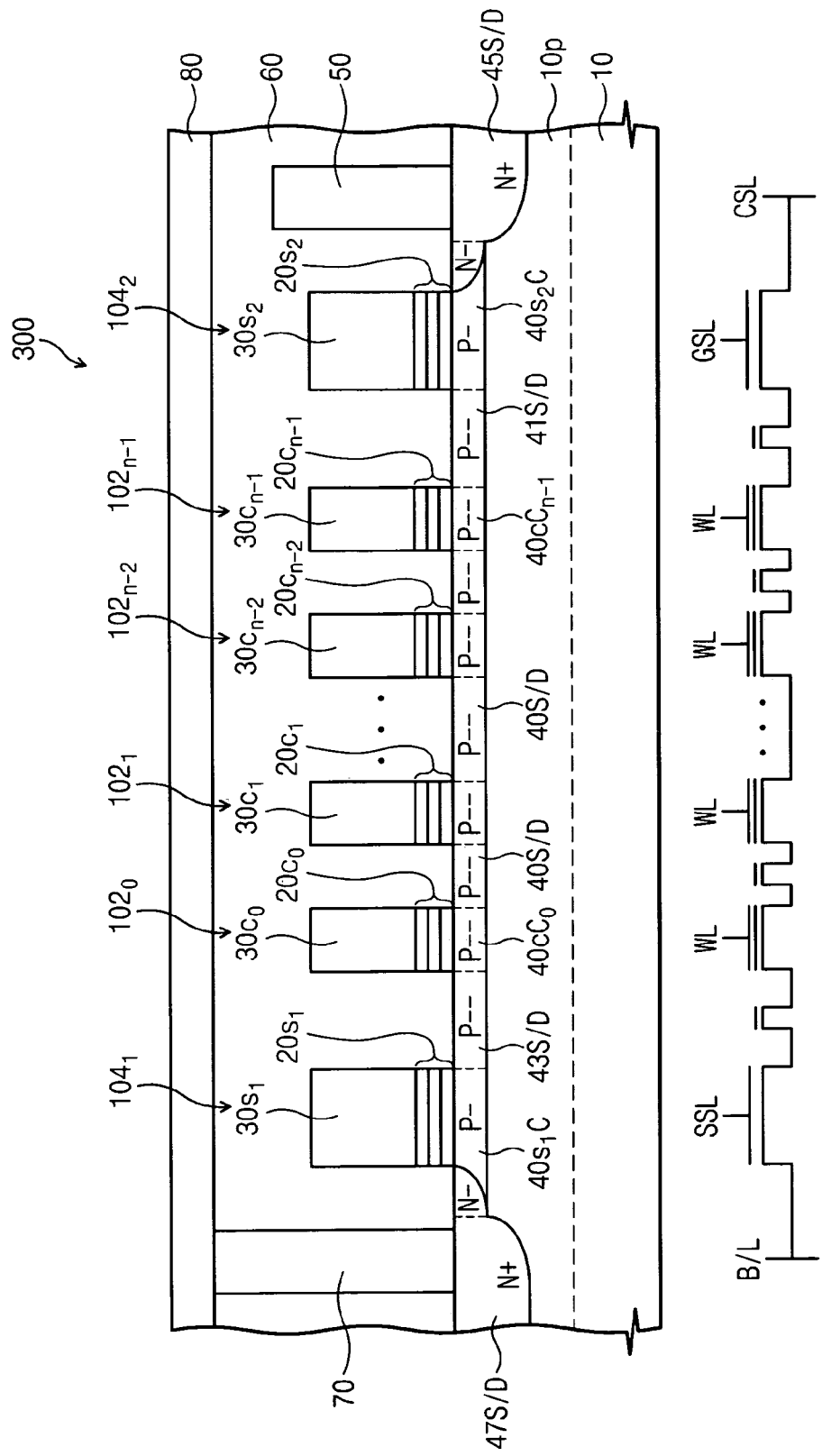
FIG. 3 illustrates a non-volatile memory in accordance with example embodiments.

FIG. 3 illustrates another variation of a non-volatile memory 300 in accordance with example embodiments. FIG. 3 is similar to FIG. 1, in that in FIG. 3, each of plurality of memory transistors 1020-102n−1 in series includes a channel region 40c0-400cn−1 and source/drain regions 40S/D having the same dopant type. However, in FIG. 3, the dopant type of the source/drain region 41S/D and/or 43S/D is the same as the dopant type for the channel region 40c0-400cn−1 and source/drain regions 40S/D. In example embodiments, the dopant type is p-type.

Similar to FIG. 1, the NAND array of FIG. 3 may also include a string select line (SSL), wordlines (WL), ground select line (GSL), the common source line (CSL) and bit lines (B/L), which may be extended by the NAND string. As shown in FIG. 3, the P-type dopant of the source/drain region 41S/D and/or 43S/D is illustrated in the NAND string.

Figure 4:
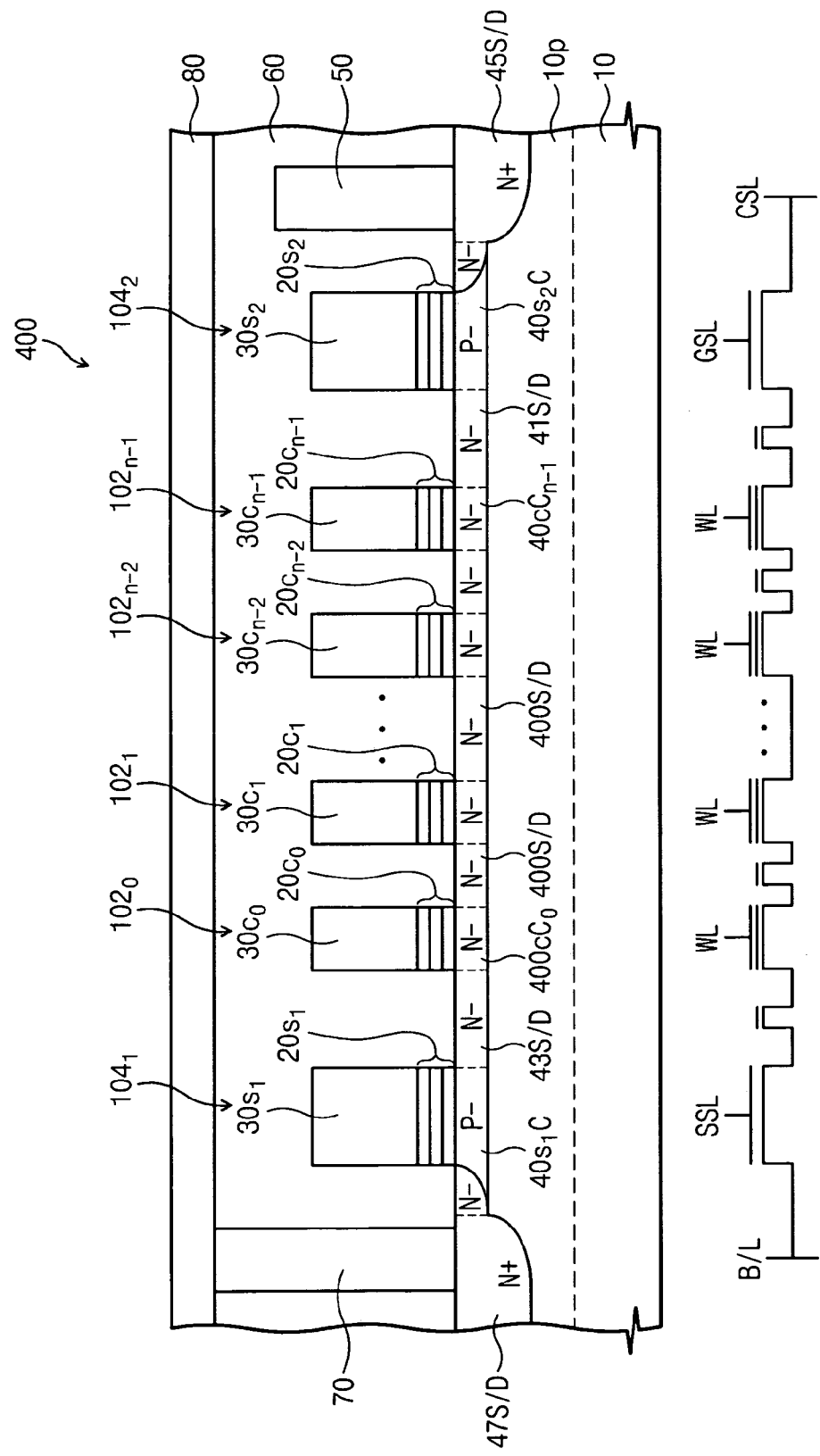
FIG. 4 illustrates a non-volatile memory in accordance with example embodiments.

FIG. 4 illustrates another variation of a non-volatile memory 400 in accordance with example embodiments. As illustrated in FIG. 4, the source/drain regions 41S/D, 43S/D have the same dopant type (for example, n-type) as the memory the channel regions 400c0-400cn−1.

FIGS. 5-10 illustrate a method of forming a non-volatile memory device in accordance with example embodiments.

Figure 5:
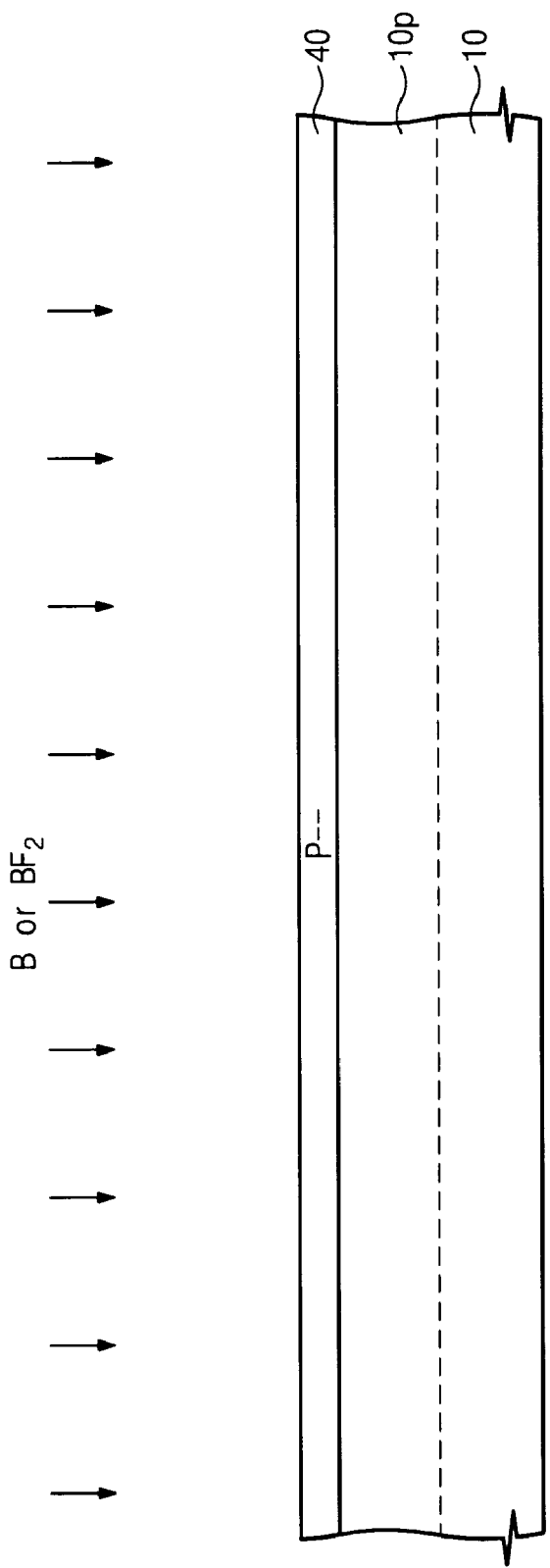
FIGS. 5-10 illustrate a method of manufacturing a non-volatile memory in accordance with example embodiments.

As illustrated in FIG. 5, a p-well 10p may be formed in the substrate 10. Additionally, a first concentration region 40, for example, a p-type concentration region may be formed by ion implantation. In example embodiments, the implanted ions may be B or BF2 ions.

Figure 6:
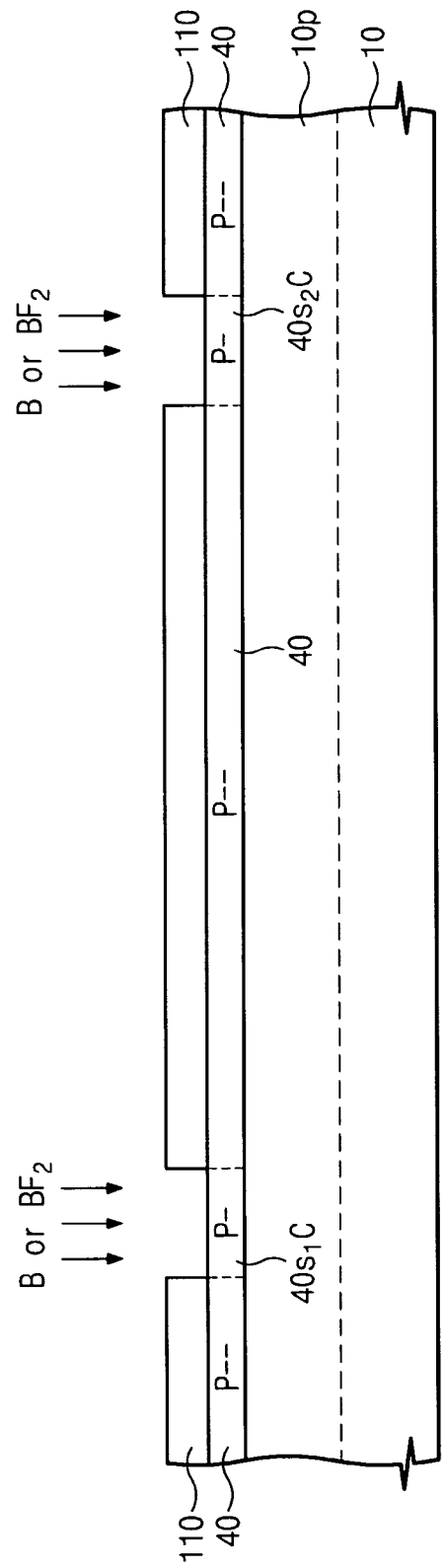

As illustrated in FIG. 6, one or more second concentration p-type regions 40s1C, 40s2C may be formed in the first concentration p-type region 40 using a first mask pattern 110. As illustrated in FIG. 6, the second concentration p-type regions 40s1C and 40s2C may be formed by ion implantation, for example, B or BF2 ion implantation.

In example embodiments, the concentration of ions in the one or more second concentration p-type regions 40s1C, 40s2C is greater than the concentration of ions in the first concentration region 40.

Figure 7:
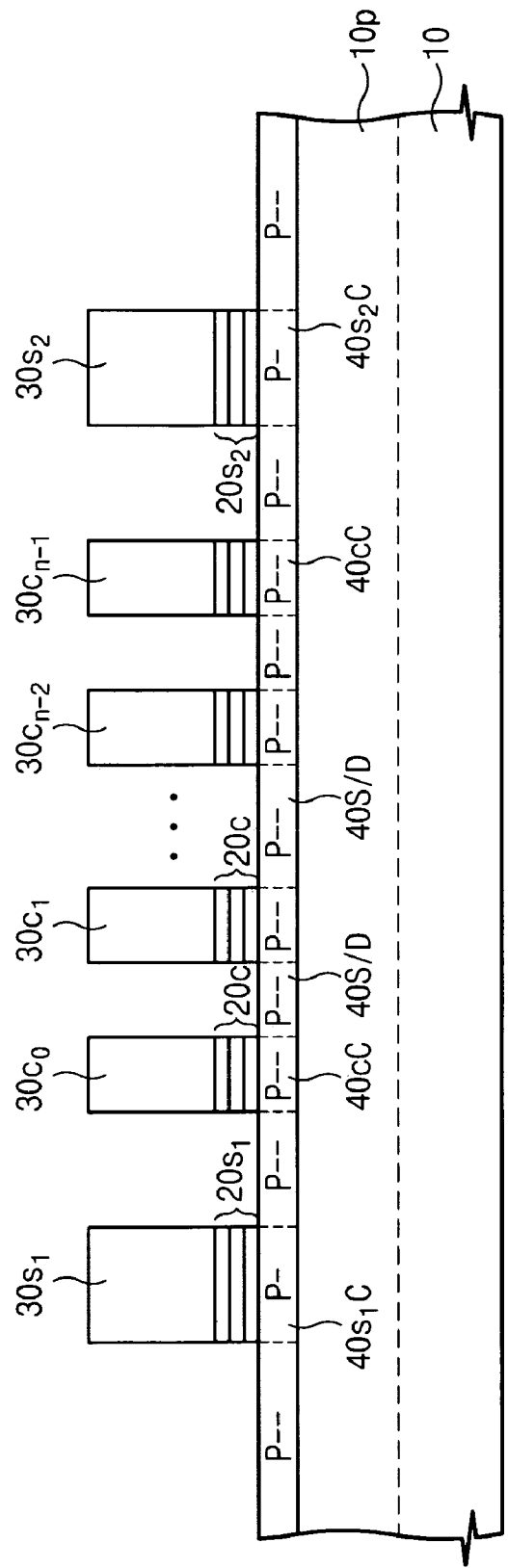

As illustrated in FIG. 7, a tunneling insulating pattern, a charge storage pattern, a blocking pattern (collectively, 20s1, 20s2, and 20c0-20cn−1) and a conductive pattern 30s1, 30s2, and 30c0-30cn−1 may be applied to form the stacked structure of the plurality of memory transistors 1020-102n−1 and the select transistors 1041, 1042. In example embodiments, the string select gate 30s1, the cell gates 30c0-30cn−1, and the ground select gate 30s2 may be formed by a patterning process.

In example embodiments, the memory pattern 20cn may be a charge trap memory, a floating gate memory, or a nanocrystalline memory. In example embodiments, the charge trap memory may be a SONOS memory or a TANOS memory. In other example embodiments, the memory pattern 20cn may be any type of flash memory structure. Example NAND cell string structures and cell gate structures are disclosed in U.S. Pat. No. 6,858,906, U.S. Patent Application No. 2004/0169238, filed on Mar. 8, 2004, and U.S. Patent Application No. 2006/0180851, filed on Apr. 12, 2006 and are incorporated by reference herein, in their entirety.

Figure 8:
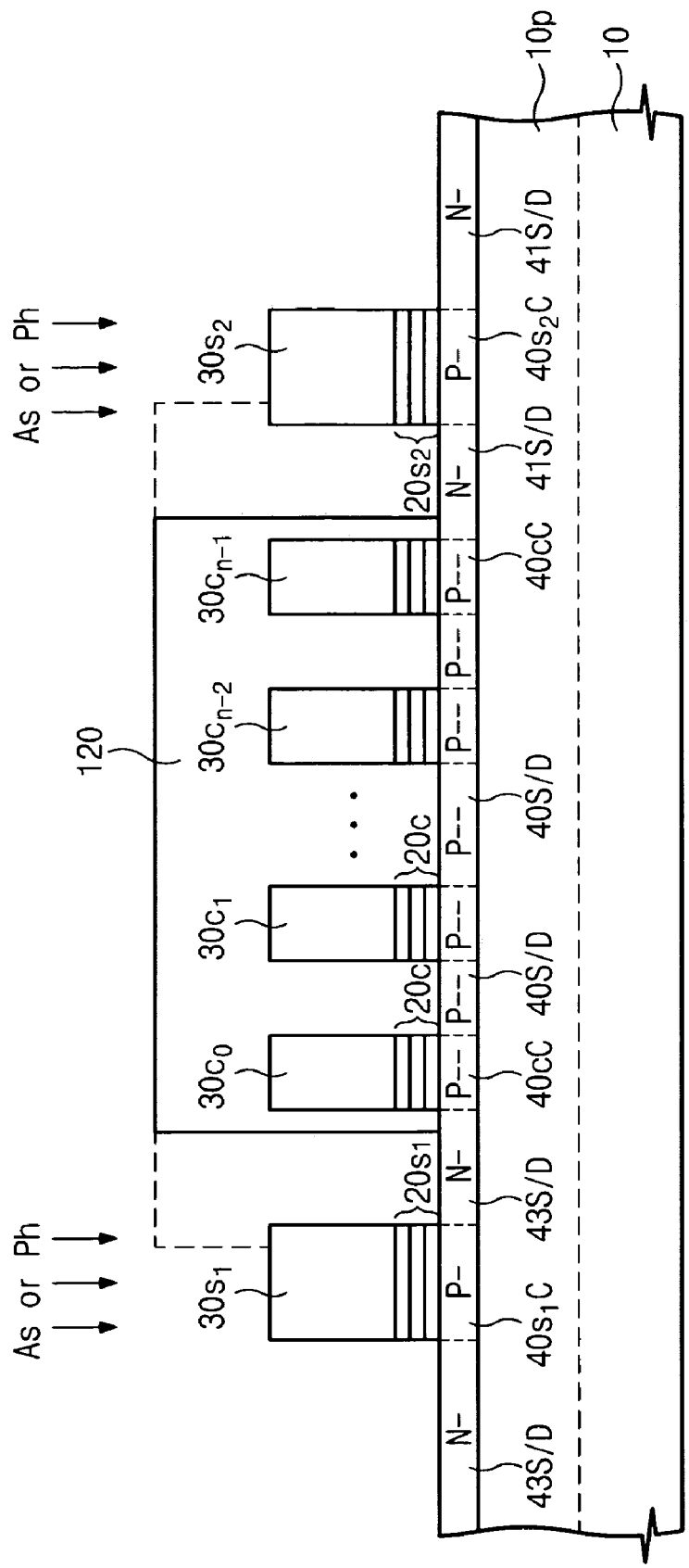

As illustrated in FIG. 8, third concentration source/drain regions 41S/D, 43S/D may be formed by ion implantation. In example embodiments, the third concentration source/drain regions 41S/D, 43S/D may be of N-type, and may be formed, for example, by implanting As or Ph ions. The cell gates 30c0-30cn−1 may be protected from the As or Ph ion implantation by a second mask pattern 120.

Figure 9:
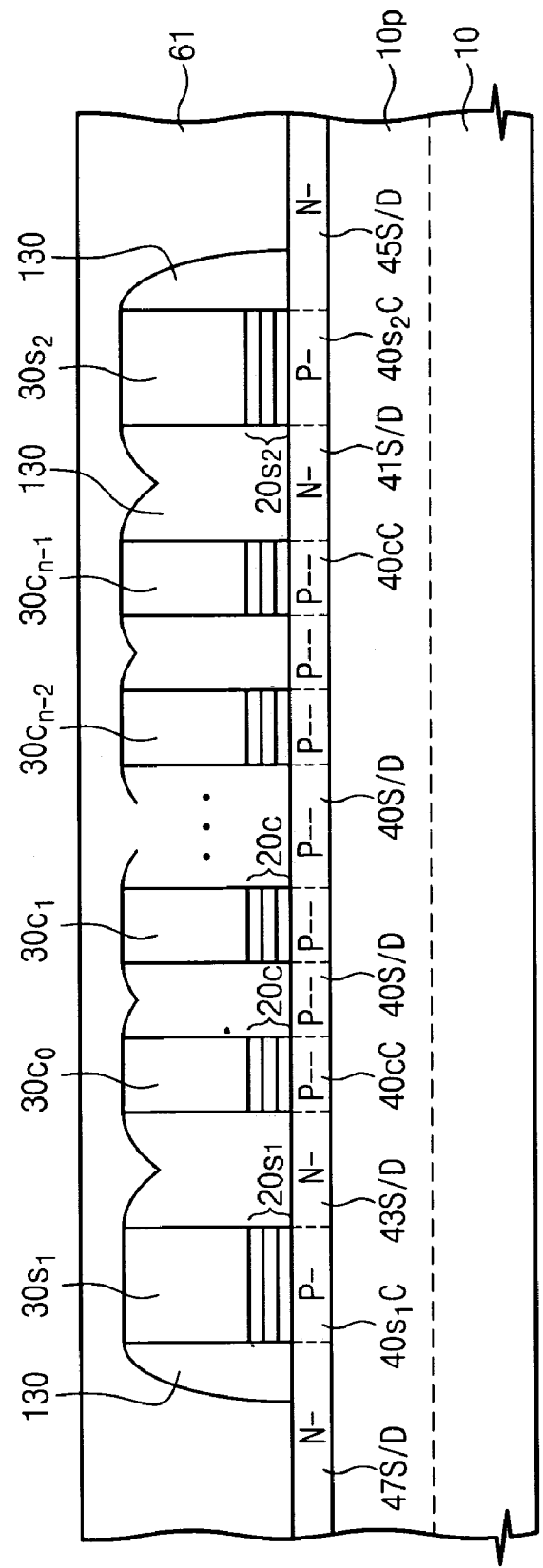

As illustrated in FIG. 9, a spacer 130 and/or a first interlayer dielectric (ILD) 61 may be formed. The first interlayer dielectric (ILD) 61 may be made of a material selected from the group consisting of SiO2, a low-k material, BPSG, HDP, and mixtures thereof.

Figure 10:
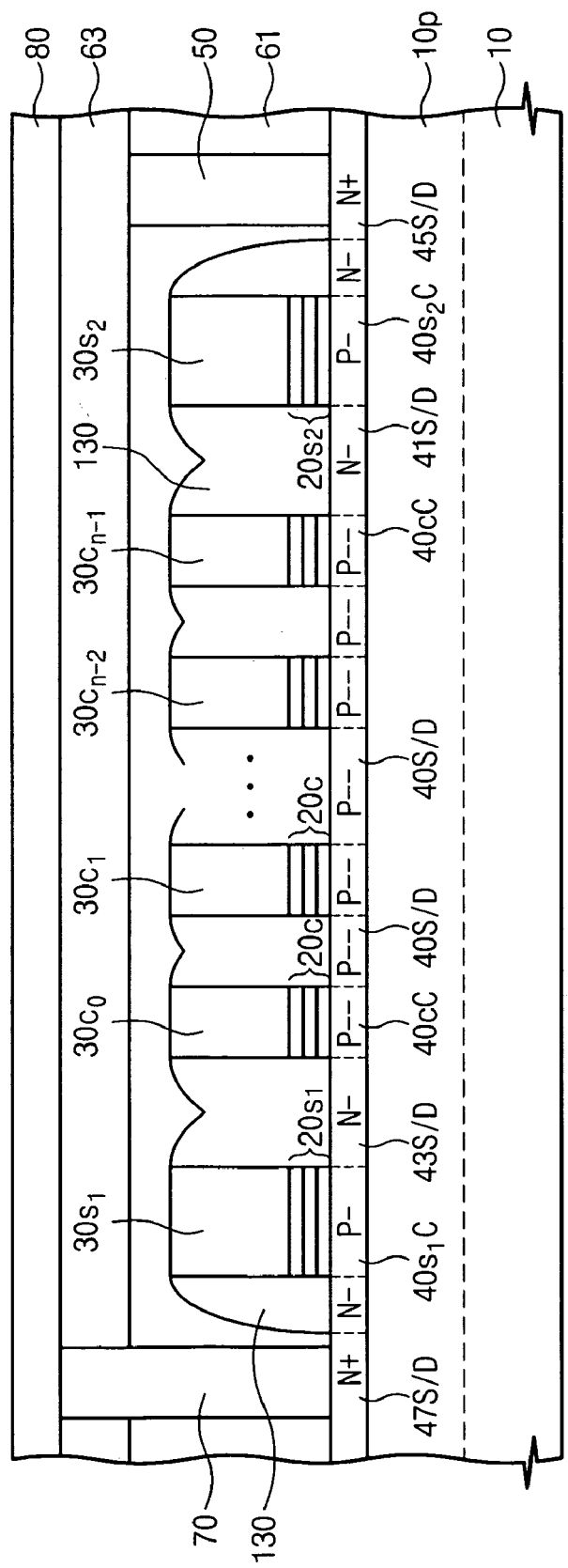

In example embodiments, a fourth concentration region 45S/D may be formed. As illustrated in FIG. 10, the common source line (CSL) 50 may also be formed, connected to the fourth concentration region 45S/D. The CSL 50 may be made of a material selected from the group consisting of W, TiN, TaN, Cu, and mixtures thereof. In example embodiments, a second ILD 63 may be formed, connected to the common source line (CSL) 50. The second interlayer dielectric (ILD) 63 may be made of a material selected from the group consisting of SiO2, a low-k material, BPSG, HDP, and mixtures thereof. The second interlayer dielectric (ILD) 63 may be made of the same or different material as the first interlayer dielectric (ILD) 61.

In example embodiments, a fifth concentration region 47S/D may be formed. As illustrated in FIG. 10, a bit line contact 70 may be formed connected to the fifth concentration region 45S/D. The fourth concentration region 45S/D and the fifth concentration region 47S/D may have the concentration or different concentrations. The bit line contact 70 may be made of a material selected from the group consisting of W, WN TiN, TaN, Cu, and mixtures thereof.

As illustrated in FIG. 10, the bit line 80 may be formed, connected to the bit line contact 70. The bit line 80 may be made of a material selected from the group consisting of W, WN, TiN, TaN, Cu, and mixtures thereof.

The method of manufacturing a non-volatile memory of FIGS. 5-10 may be used to manufacture the non-volatile memory 100 of FIG. 1.

Figure 11:
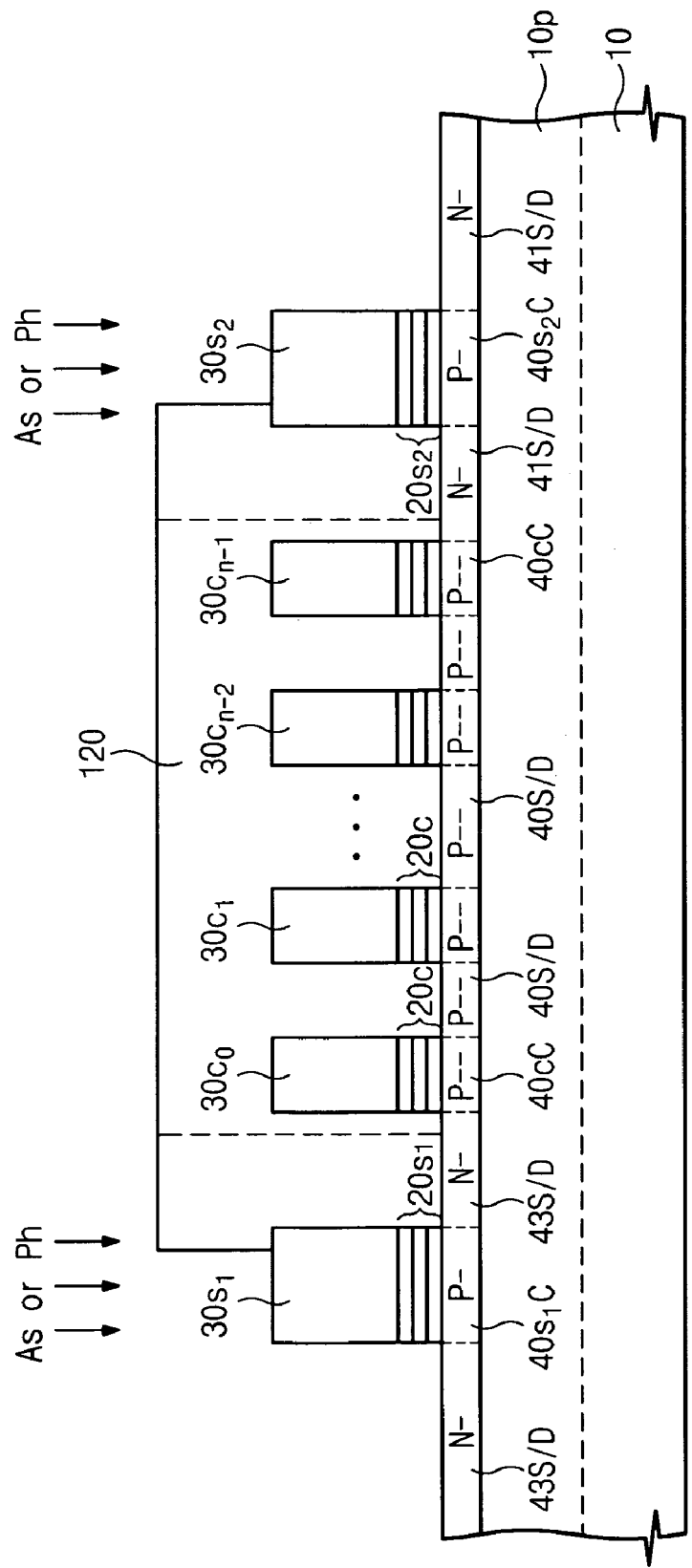
FIG. 11 illustrates a method of manufacturing a non-volatile memory in accordance with example embodiments.

FIG. 11 illustrates a variant of FIG. 8 where the second mask pattern 120 is wider. Such a modification may result in the formation of the non-volatile memory device 300 of FIG. 3, instead of the non-volatile memory device 100 of FIG. 1.

FIGS. 12-20 illustrate a method of manufacturing a non-volatile memory in accordance with example embodiments.

Figure 12:
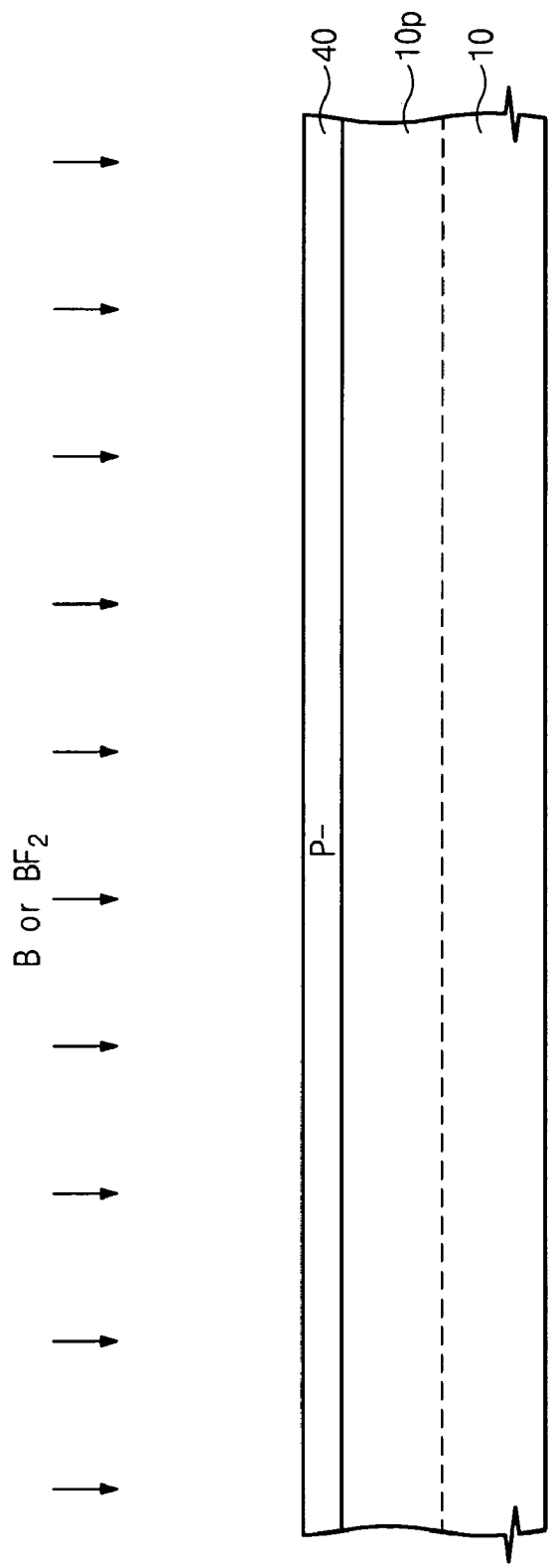
FIGS. 12-21 illustrate a method of manufacturing a non-volatile memory in accordance with example embodiments.

As illustrated in FIG. 12, a p-well 10p may be formed in the substrate 10, similar to as shown in FIG. 5. Additionally, a first concentration region 40, for example, a p-type concentration region may be formed by ion implantation. In example embodiments, the implanted ions may be B or BF2 ions.

Figure 13:
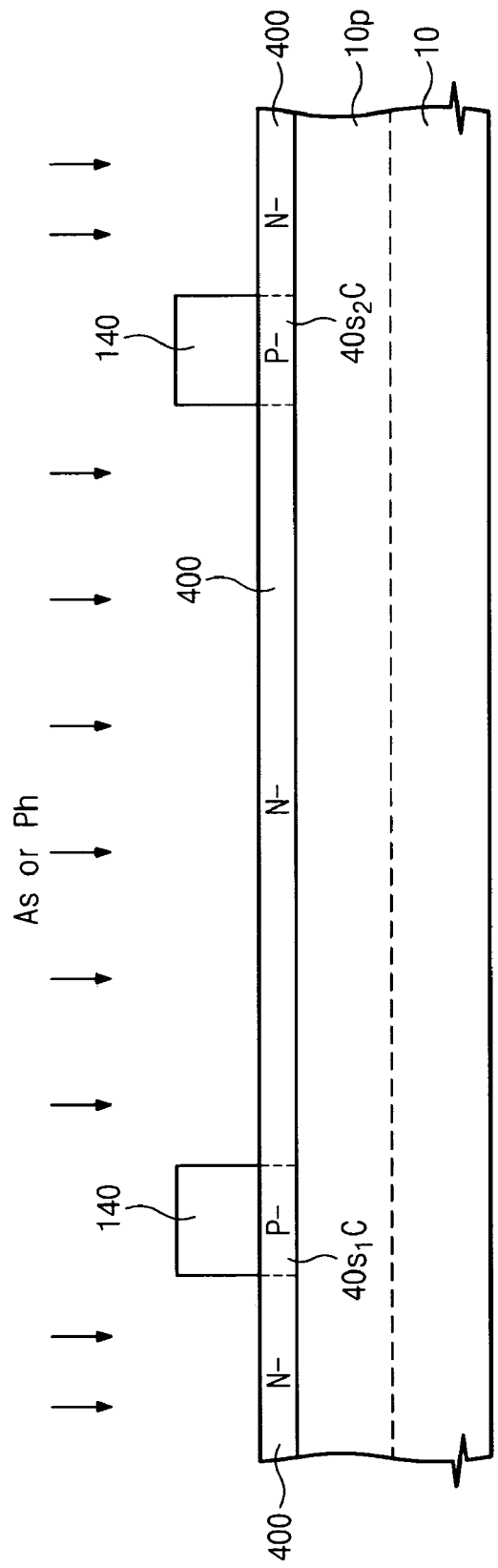

As illustrated in FIG. 13, a first mask 140 may be used to form an n-type impurity region 400, everywhere except where the first mask 140 is present. Under the first mask 140 are formed one or more second concentration p-type regions 40s1C, 40s2C

As illustrated in FIG. 13, the n-type impurity region 400 may be formed by ion implantation, for example, As or Ph ion implantation.

Figure 14:
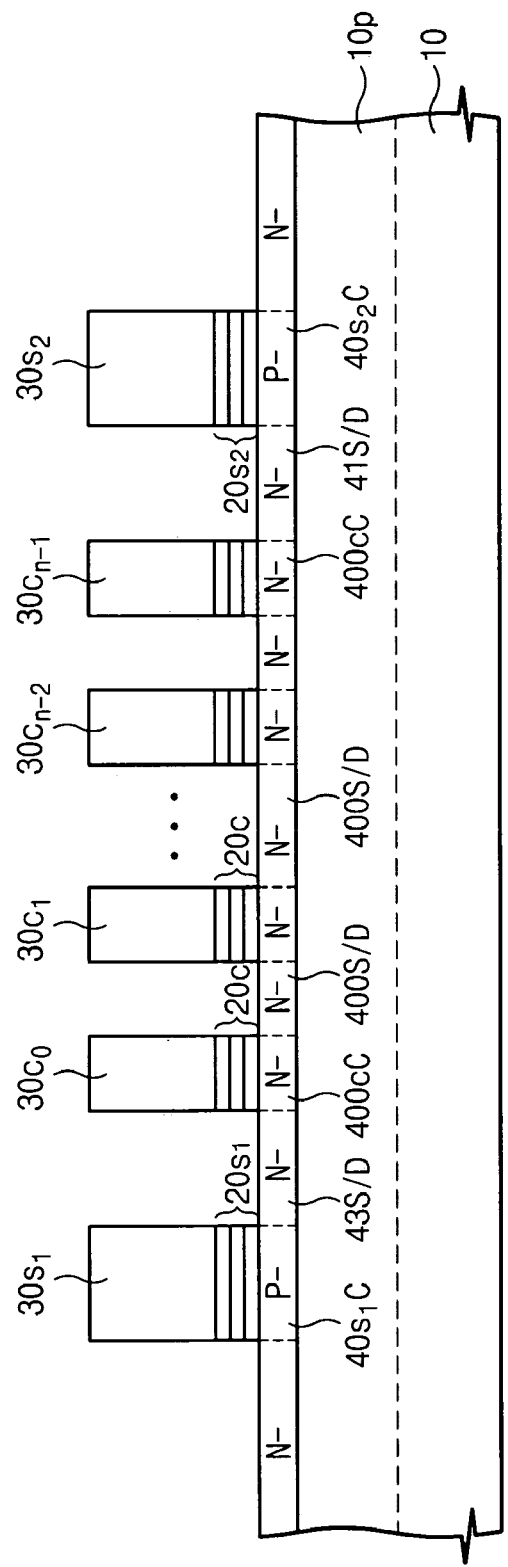

As illustrated in FIG. 14, a tunneling insulating pattern, a charge storage pattern, a blocking pattern (collectively, 20s1, 20s2, and 20c0-20cn−1) and a conductive pattern 30s1, 30s2, and 30c0-30cn−1 may be applied to form the stacked structure of the plurality of memory transistors 1020-102n−1 and the select transistors 1041, 1042. In example embodiments, the string select gate 30s1, the cell gates 30c0-30cn−1, and the ground select gate 30s2 may be formed by a patterning process. The process shown in FIG. 14 may be similar to the process illustrated in FIG. 7.

In example embodiments, the memory pattern 20cn may be a charge trap memory, a floating gate memory, or a nanocrystalline memory. In example embodiments, the charge trap memory may be a SONOS memory or a TANOS memory. In other example embodiments, the memory pattern 20cn may be any type of flash memory structure. Example NAND cell string structures and cell gate structures are disclosed in U.S. Patent Publication No. US 2004/0169238 and U.S. Pat. No. 6,858,906, the contents of each of which are herein incorporated by reference in their entirety.

Figure 15:
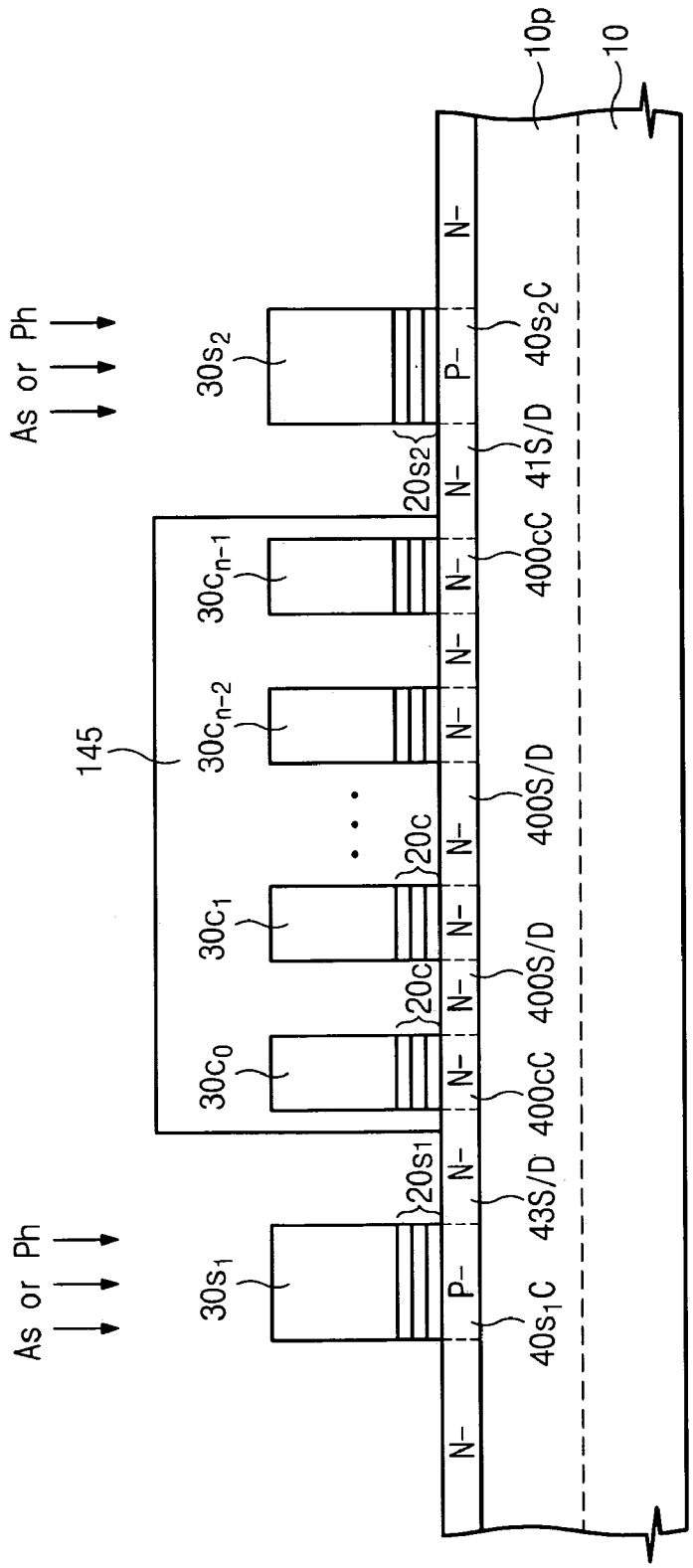

As illustrated in FIG. 15, third concentration source/drain regions 41S/D, 43S/D may be formed by ion implantation. In example embodiments, the third concentration source/drain regions 41S/D, 43S/D may be of N-type, and may be formed, for example, by implanting As or Ph ions. The cell gates 30c0-30cn−1 may be protected from the As or Ph ion implantation by a second mask pattern 145. The process shown in FIG. 15 may be similar to the process illustrated in FIG. 8.

Figure 16:
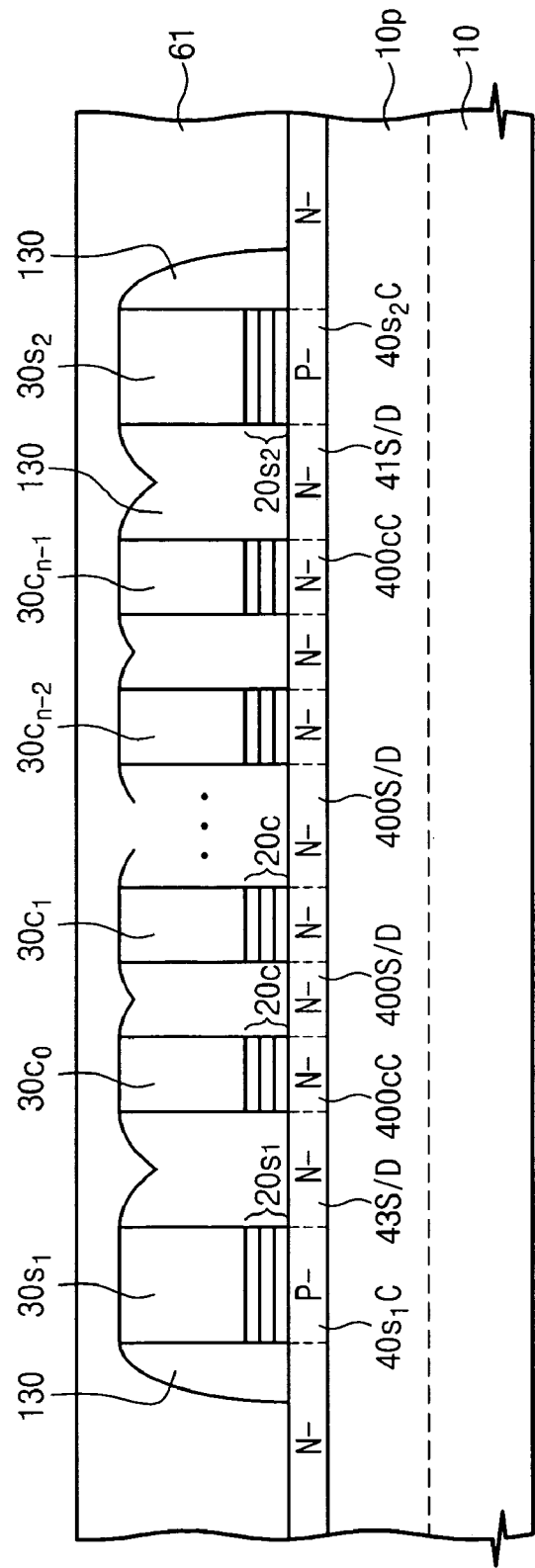

As illustrated in FIG. 16, a spacer 130 and/or a first interlayer dielectric (ILD) 61 may be formed. The first interlayer dielectric (ILD) 61 may be made of a material selected from the group consisting of SiO2, a low-k material, BPSG, HDP, and mixtures thereof. The process shown in FIG. 16 may be similar to the process illustrated in FIG. 9.

Figure 17:
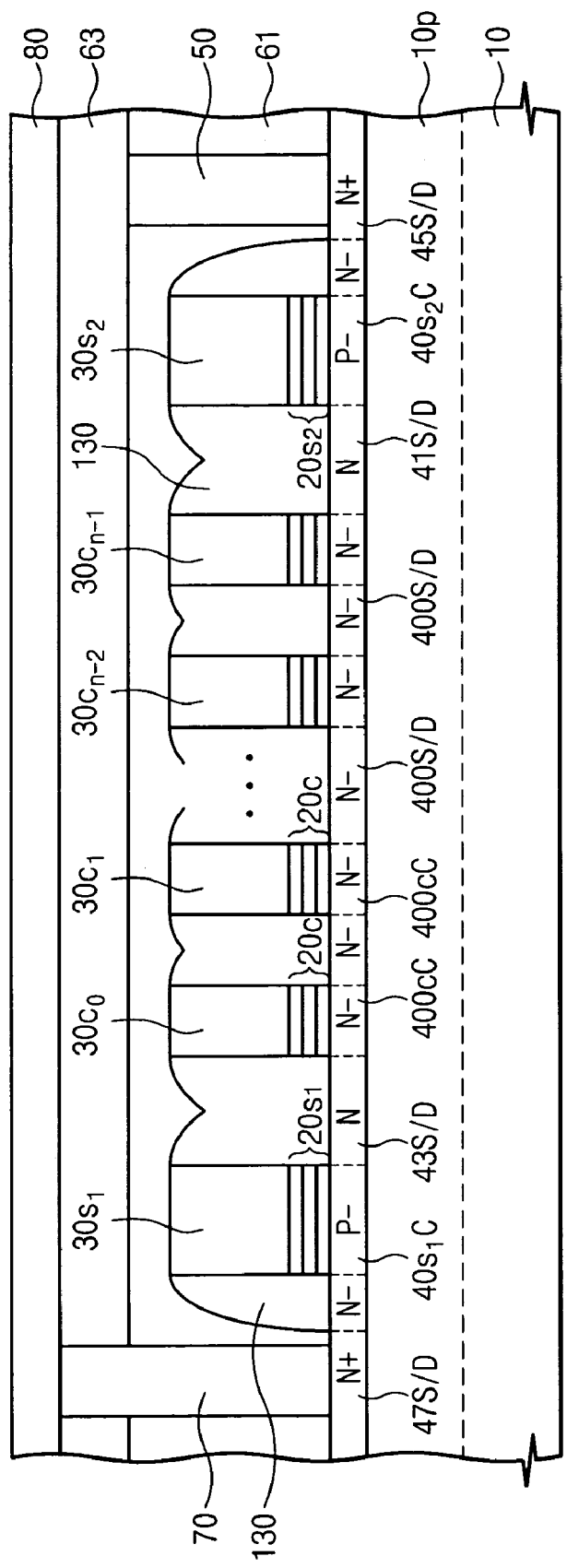

In example embodiments, a fourth concentration region 45S/D may be formed. As illustrated in FIG. 17, the common source line (CSL) 50 may also be formed, connected to the fourth concentration region 45S/D. The CSL 50 may be made of a material selected from the group consisting of W, TiN, TaN, Cu, and mixtures thereof In example embodiments, a second ILD 63 may be formed, connected to the common source line (CSL) 50. The second interlayer dielectric (ILD) 63 may be made of a material selected from the group consisting of SiO2, a low-k material, BPSG, HDP, and mixtures thereof The second interlayer dielectric (ILD) 63 may be made of the same or different material as the first interlayer dielectric (ILD) 61. The process shown in FIG. 17 may be similar to the process illustrated in FIG. 10.

In example embodiments, a fifth concentration region 47S/D may be formed. As illustrated in FIG. 17, a bit line contact 70 may be formed connected to the fifth concentration region 45S/D. The fourth concentration region 45S/D and the fifth concentration region 475S/D may have the concentration or different concentrations. The bit line contact 70 may be made of a material selected from the group consisting of W, WN TiN, TaN, Cu, and mixtures thereof.

As illustrated in FIG. 17, the bit line 80 may be formed, connected to the bit line contact 70. The bit line 80 may be made of a material selected from the group consisting of W, WN, TiN, TaN, Cu, and mixtures thereof.

FIGS. 18-21 illustrate a method of manufacturing a non-volatile memory in accordance with example embodiments.

Figure 18:
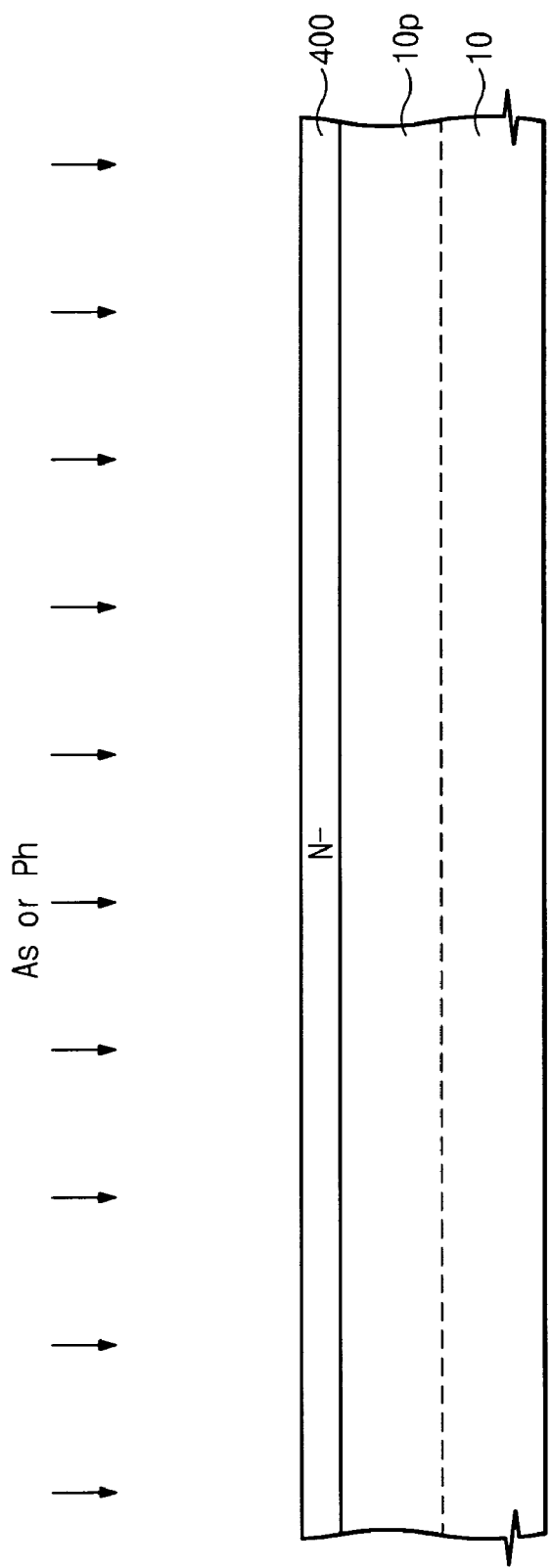
Figure 19:
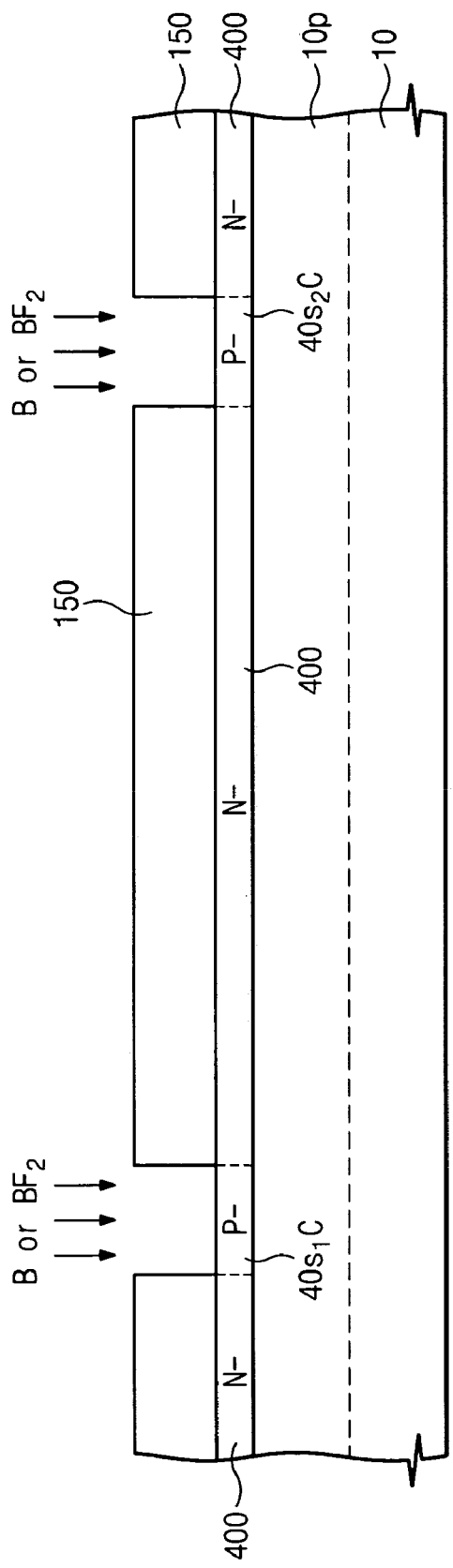

As shown in FIG. 18, an n-type impurity region 400 may be formed by ion implantation. In example embodiments, the ions are As or Ph ions. As shown in FIG. 19, a first mask pattern 150 may be formed on the n-type impurity region 400, and the select transistor channel region 40s1C, 40s2C may be formed of p-type by ion implantation. In example embodiments, the ions are B or BF2 ions.

Figure 20:
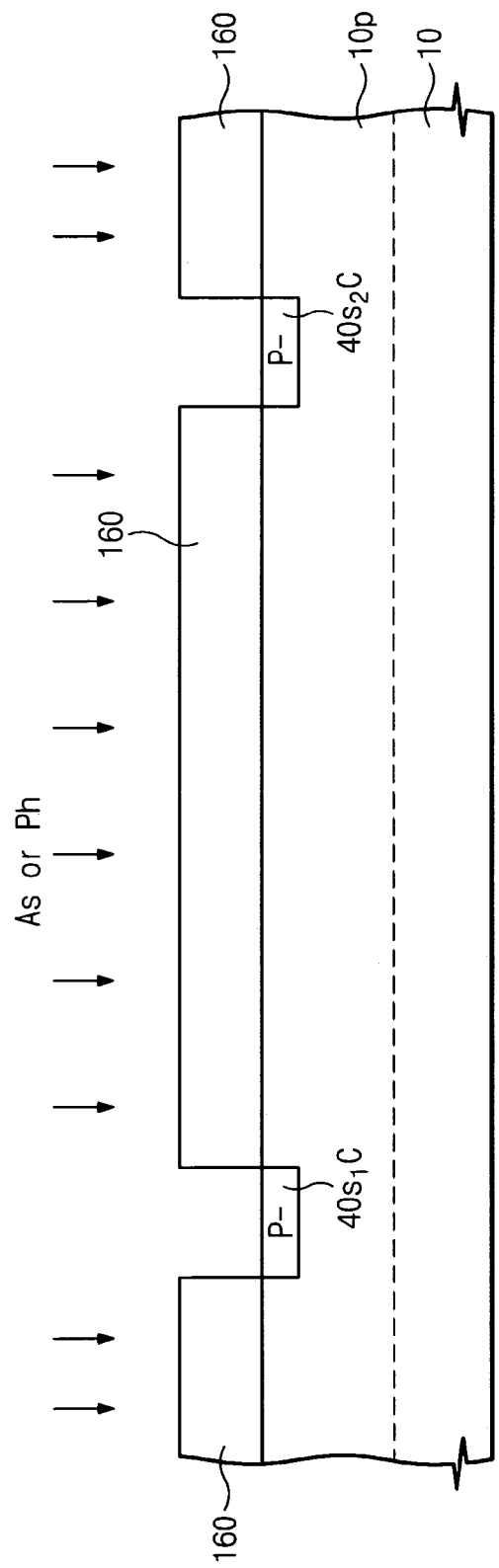
Figure 21:
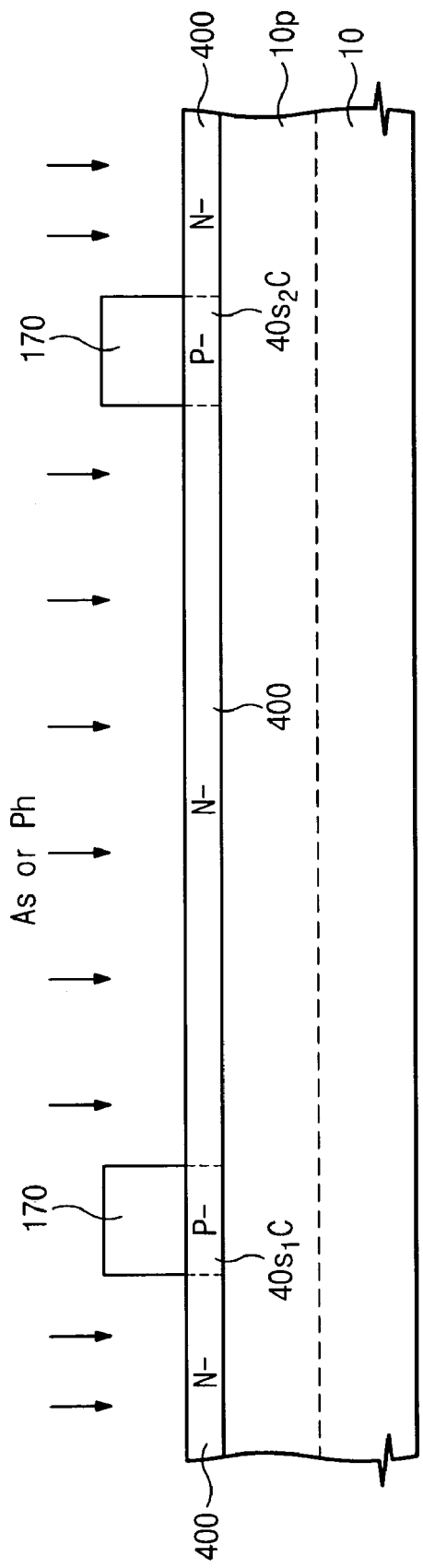

As shown in FIG. 20, the first mask pattern 150 may be exposed to ion implantation, for example, n-type ion implantation, to form an ion implanted mask layer 160. In example embodiments, the ions are As or Ph ions. As shown in FIG. 21, a third mask layer 170 may be formed over the select transistor channel regions 40s1C, 40s2C and the ion implanted mask layer 160 may be removed. The n-type impurity region 400 may then again be exposed to ion implantation. In example embodiments, the ions are As or Ph ions.

As shown in FIGS. 20-21, a select transistor channel region 40s1C, 40s2C may be formed as a p-type using ion implantation. An n-type region 400 may be formed.

The method of manufacturing a non-volatile memory of FIGS. 12-17 and/or 18-21 may be used to manufacture the non-volatile memory 200 of FIG. 2 or the non-volatile memory 400 of FIG. 4.

Figure 22:
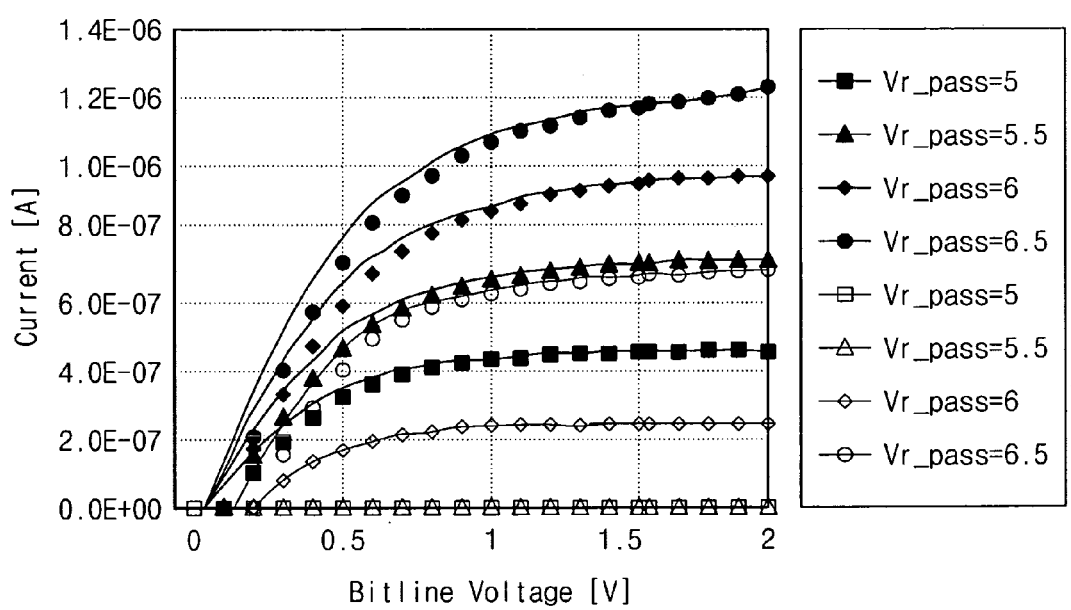
FIG. 22 illustrates experimental data comparing example embodiments with the conventional art.

FIG. 22 illustrates experimental data comparing example embodiments with the conventional art. FIG. 22 illustrates plots of bit line voltage versus current. The solid symbols illustrate example embodiments of doping concentrations of select gate channel regions which is greater than the doping concentration of cell gate channel regions and S/D regions for a variety of VR_pass voltages. Similarly, the open symbols illustrate doping concentrations of select gate channel regions which are equal to doping concentrations of cell gate regions and S/D regions. As illustrated in FIG. 22, a higher current may be obtained for the same bit line voltage in example embodiments, where the doping concentration of the select gate channel region is greater than the doping concentration of the cell gate channel region and the source/drain region.

As shown in FIG. 22, a higher Vr_pass voltage, and hence a higher current, may be generated from the same bit line voltage. In conventional systems, the Vr_pass voltage was boosted by a voltage boosting circuit. Example embodiments may alleviate the need for such a voltage boosting circuit or may be used in conjunction with such voltage boosting circuits to further increase the value of the Vr_pass voltage. Example boosting circuits are disclosed in U.S. Pat. No. 5,473,563 and U.S. Pat. No. 5,546,341, the contents of each of which are herein incorporated by reference in their entirety.

Figure 23:
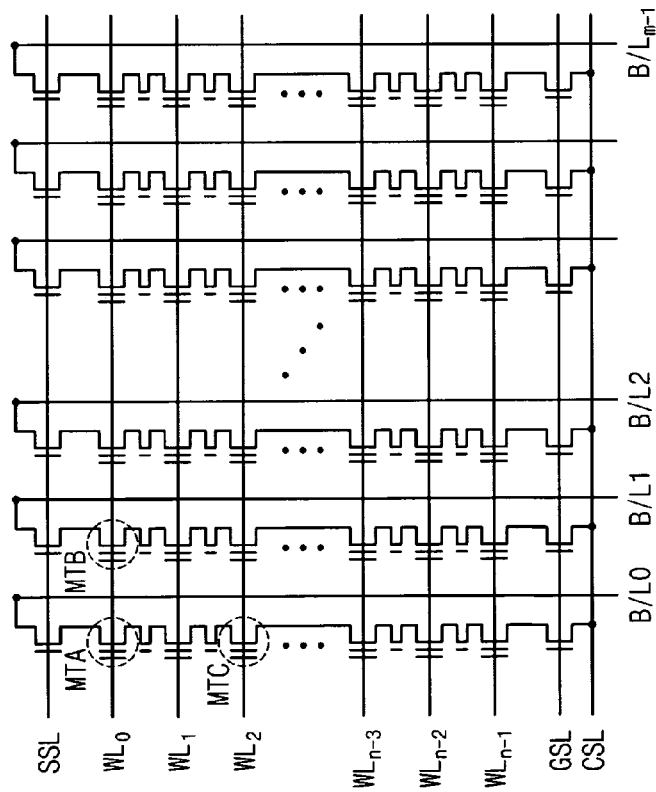
FIG. 23 illustrates an equivalent array circuit and its operation according example embodiments.

FIG. 23 illustrates an equivalent array circuit and its operation according example embodiments.

As discussed above, characteristics of program disturbance may be improved in example embodiments due to lower capacitive coupling between cell gate and channel region (for example, as a result of lower doping). Additionally, the short channel effect may be reduced or removed, for example, due to no pn junction. Additionally, easier inversion may make it possible to improve the performance of the array circuit.

To program a selected memory transistor 102n in the NAND cell, a voltage Vcc may be applied to the gate of the select transistor 1041 and a high voltage of 15-20 volts may be applied to the control gate of the selected memory transistor 102n, while 0 volts may be applied to the gate of the selection transistor 1042, and an intermediate voltage Vpass, for example, of about 10 volts may be applied to control gates of unselected memory transistors 1020-102n−1, except 102n.

To read a selected memory transistor 102n in the NAND cell, a voltage Vsel may be applied to the control gate of the selected memory transistor 102n, while a voltage Vr_pass may be applied to the gate of the select transistor 1041, the gate of the second selection transistor select transistor 1042, and control gates of unselected memory transistors 1020-102n−1, except 102n.

Erasure of all memory transistors in the NAND cell of FIG. 23 may be performed by applying 0 volts to all control gates and a high potential of 21 volts to the p-type well region and the n-type substrate, thereby uniformly extracting electrons from their gates to the well region.

Figure 24:
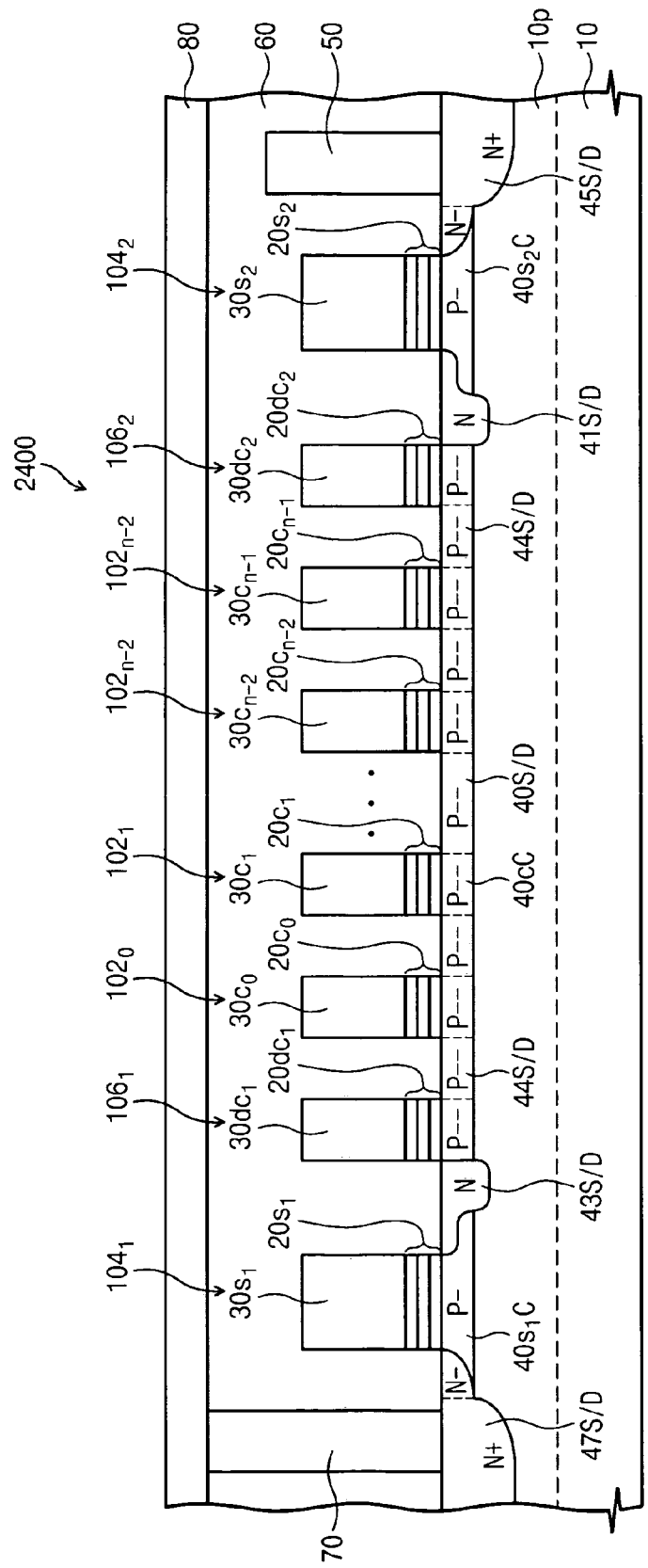
FIG. 24 illustrates a non-volatile memory including one or more dummy transistors in accordance with example embodiments.

FIG. 24 illustrates a non-volatile memory in accordance with example embodiments. As illustrated in FIG. 24, the non-volatile memory 2400 may include all the elements of the non-volatile memory 100 of FIG. 1. In addition, the non-volatile memory 2400 may further include dummy transistors

1061, 1062, each including a dummy gate insulating pattern 20*d*C, a dummy cell gate 30*d*C, and/or a dummy source/drain region 44S/D. In example embodiments, one or more dummy cell gates may reduce hot carrier so characteristics of program disturbance may be improved.

As illustrated in FIG. 24, in example embodiments, the dummy source/drain region 44S/D may have the same dopant type as the source/drain regions 40S/D of the plurality of memory transistors 102$_0$-102*n*-1 in series and the channel regions 40*c*0-40*cn*-1 of the plurality of memory transistors 102$_0$-102*n*-1 in series.

As illustrated in FIG. 24, in example embodiments, the dummy source/drain region 44S/D may have a different doping concentration than the channel regions 40*s*1C, 40*s*2C of the select transistors 1041, 1042. As shown in FIG. 24, P- indicates a higher P-type dopant concentration than P--.

Figure 25:
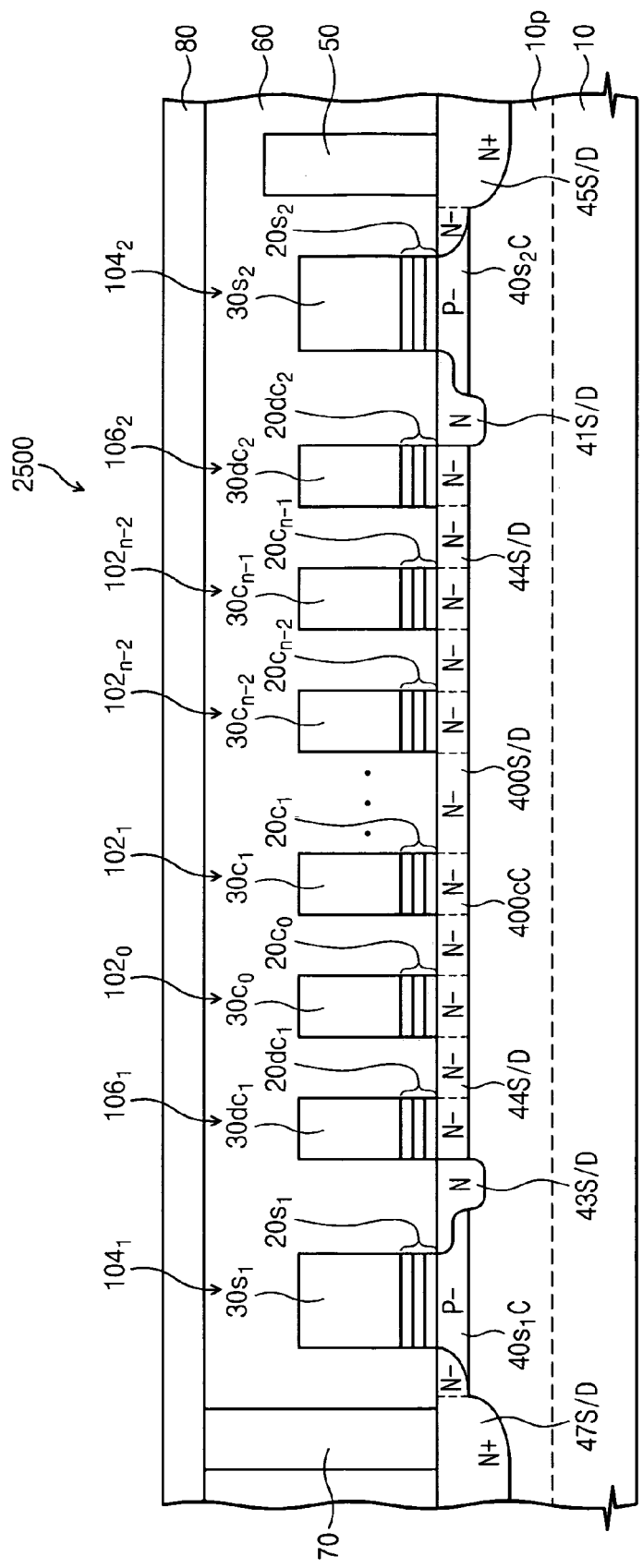
FIG. 25 illustrates a non-volatile memory including one or more dummy transistors in accordance with example embodiments.

FIG. 25 illustrates a non-volatile memory in accordance with example embodiments. As illustrated in FIG. 25, the non-volatile memory 2500 may include all the elements of the non-volatile memory 200 of FIG. 2. In addition, the non-volatile memory 2500 may further include dummy transistors 1061, 1062, each including a dummy gate insulating pattern 20*d*C, a dummy cell gate 30*d*C, and/or a dummy source/drain region 44S/D. In example embodiments, one or more dummy cell gates may reduce hot carrier so characteristics of program disturbance may be improved.

As illustrated in FIG. 25, in example embodiments, the dummy source/drain region 44S/D may have the same dopant type as the source/drain regions 400S/D of the plurality of memory transistors 102$_0$-102*n*-1 in series and the channel regions 400*c*0-400*cn*-1 of the plurality of memory transistors 102$_0$-102*n*-1 in series.

Figure 26:
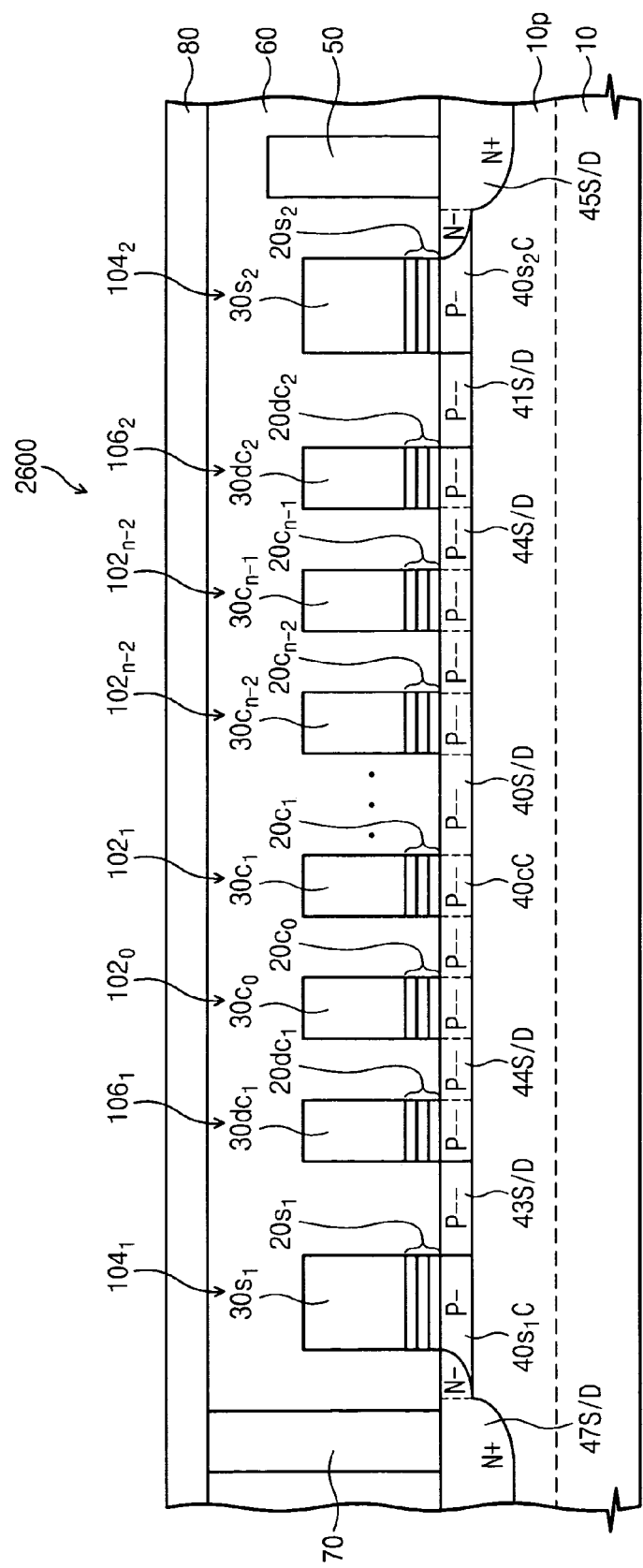
FIG. 26 illustrates a non-volatile memory including one or more dummy transistors in accordance with example embodiments.

FIG. 26 illustrates a non-volatile memory in accordance with example embodiments of the present invention. As illustrated in FIG. 26, the non-volatile memory 2600 may include all the elements of the non-volatile memory 300 of FIG. 3. In addition, the non-volatile memory 2600 may further include dummy transistors 1061, 1062, each including a dummy gate insulating pattern 20*d*C, a dummy cell gate 30*d*C, and/or a dummy source/drain region 44S/D. In example embodiments, one or more dummy cell gates may reduce hot carrier so characteristics of program disturbance may be improved.

As illustrated in FIG. 26, in example embodiments, the dummy source/drain region 44S/D may have the same dopant type as the source/drain regions 40S/D of the plurality of memory transistors 102$_0$-102*n*-1 in series and the channel regions 40*c*0-40*cn*-1 of the plurality of memory transistors 102$_0$-102*n*-1 in series.

As illustrated in FIG. 26, in example embodiments, the dummy source/drain region 44S/D may have a different doping concentration than the channel regions 40*s*1C, 40*s*2C of the select transistors 1041, 1042. As shown in FIG. 26, P- indicates a higher P-type dopant concentration than P--.

Figure 27:
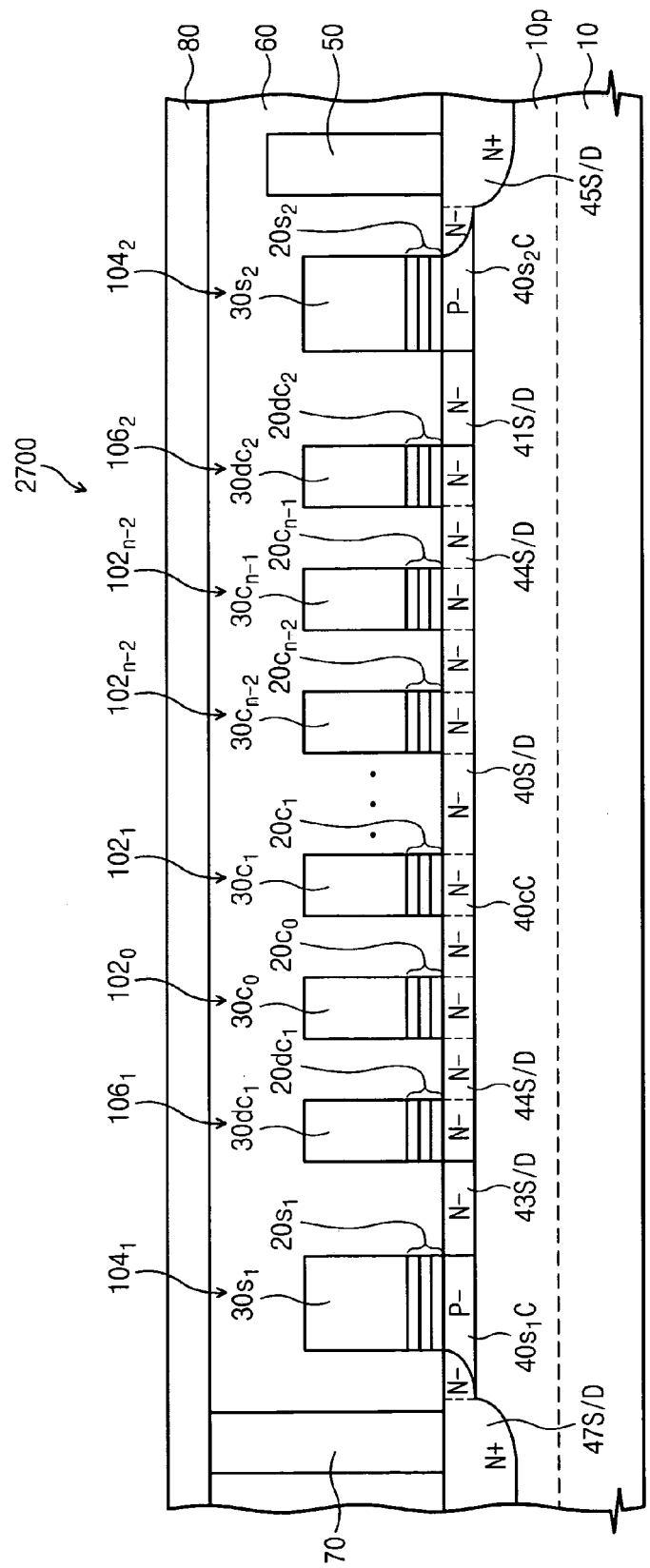
FIG. 27 illustrates a non-volatile memory including one or more dummy transistors in accordance with example embodiments.

FIG. 27 illustrates a non-volatile memory in accordance with example embodiments of the present invention. As illustrated in FIG. 27, the non-volatile memory 2700 may include all the elements of the non-volatile memory 400 of FIG. 4. In addition, the non-volatile memory 2700 may further include dummy transistors 1061, 1062, each including a dummy gate insulating pattern 20*d*C, a dummy cell gate 30*d*C, and/or a dummy source/drain region 44S/D. In example embodiments, one or more dummy cell gates may reduce hot carrier so characteristics of program disturbance may be improved.

As illustrated in FIG. 27, in example embodiments, the dummy source/drain region 44S/D may have the same dopant type as the source/drain regions 400S/D of the plurality of memory transistors 102$_0$-102*n*-1 in series and the channel regions 400*c*0-400*cn*-1 of the plurality of memory transistors 102$_0$-102*n*-1 in series.

As set forth above, one or more dummy cell gates 30*d*C may be added to any of the above-described example embodiments.

Figure 28:
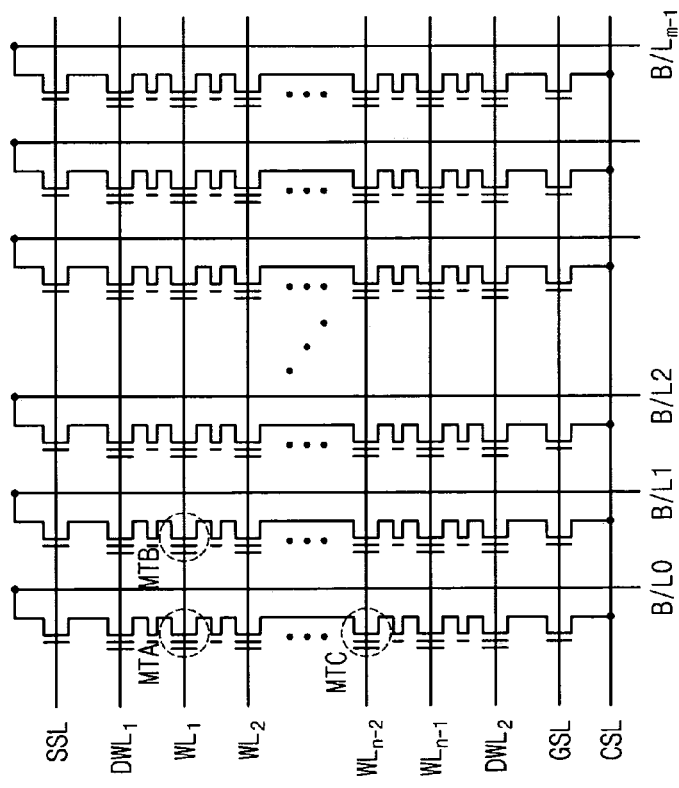
FIG. 28 illustrates an equivalent array circuit and its operation according example embodiments.

FIG. 28 illustrates an equivalent array circuit and operation for a non-volatile memory with one or more dummy transistors.

To program a selected memory transistor 102*n* in the NAND cell, a voltage Vcc may be applied to the gate of the select transistor 1041 and a high voltage of 15-20 volts may be applied to the control gate of the selected memory transistor 102*n*, while 0 volts may be applied to the gate of the selection transistor 1042, and an intermediate voltage Vpass, for example, of about 10 volts may be applied to control gates of unselected memory transistors 102$_0$-102*n*-1, except 102*n* and a voltage Vpass less than Vcc may be applied to the gate of the one or more dummy transistors 1061, 1062.

To read a selected memory transistor 102*n* in the NAND cell, a voltage Vsel may be applied to the control gate of the selected memory transistor 102*n*, while a voltage Vr_pass may be applied to the gate of the select transistor 1041, the gate of the second selection transistor select transistor 1042, the gate of the one or more dummy transistors 1061, 1062, and control gates of unselected memory transistors 102$_0$-102*n*-1, except 102*n*.

Erasure of all memory transistors in the NAND cell of FIG. 28 may be performed by applying 0 volts to all control gates and a high potential of 21 volts to the p-type well region and the n-type substrate, thereby uniformly extracting electrons from their gates to the well region.

Figure 29:
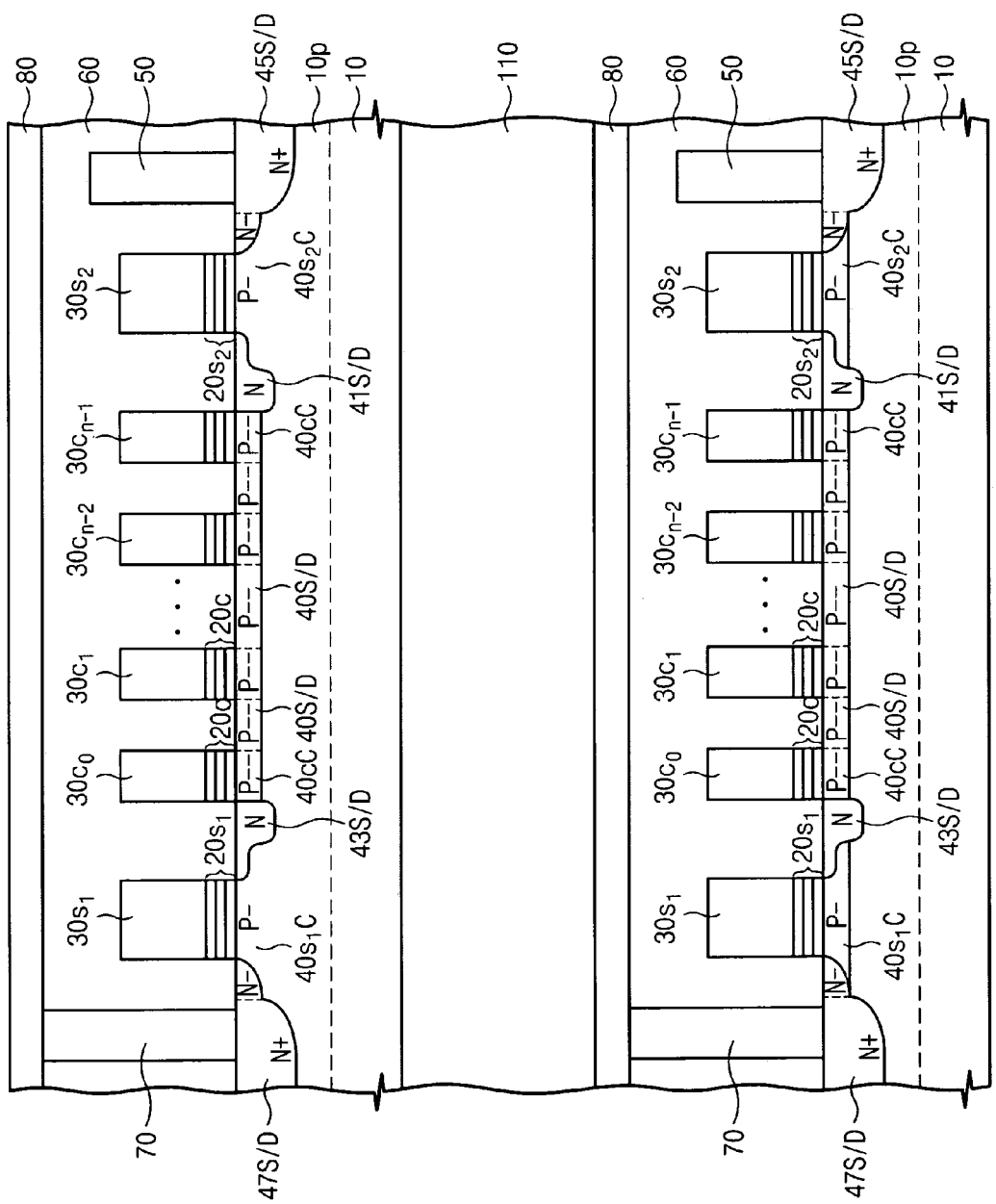
FIG. 29 illustrates an example of stacked memory transistors in accordance with example embodiments.

FIG. 29 illustrates a stack of at least two non-volatile memories. FIG. 29 illustrates a stack of two non-volatile memories in accordance with FIG. 1, separated by a dielectric 110. However, any number of non-volatile memories could be stacked. Further, any combination of different non-volatile memories 100, 200, 300, 400, 2400, 2500, 2600, and/or 2700 from any one of FIGS. 1-28 described above, may be stacked in any number or combination.

As set forth above, in example embodiments illustrated in FIGS. 1-29, the gate structure is a charge trap gate structure including a tunnel insulating layer, a charge storage layer on the tunnel insulating layer, a blocking insulating layer 135*a* on the charge storage layer, and a gate electrode on the blocking layer.

In example embodiments, the gate electrode comprises a metal layer. In example embodiments, the blocking insulating layer may have a dielectric constant which is greater than a dielectric constant of the tunnel insulating layer.

In example embodiments, the tunnel insulating layer may comprise one or more of silicon oxide, silicon oxynitride, and silicon nitride. In example embodiments, the charge storage layer may comprise one or more of silicon nitride, silicon oxynitride, silicon-rich oxide, metallic oxynitride and other metallic oxide materials. In example embodiments, the blocking insulating layer may comprise metallic oxide or metallic oxynitride of a group ☐ element or group VB element in the Mendeleef Periodic Table.

According to example embodiments, the blocking insulating layer may comprise doped metal oxide or doped metal oxynitride in which metal oxide is doped with a group ☐ element in the Mendeleef Periodic Table. In example embodiments, the blocking insulating layer 135*a* may also comprise one or more of $HfO_2$, $Al_2O_3$, $La_2O_3$, Hf1-XAlXOY, HfXSi1-XO2, Hf—Si-oxynitride, $ZrO_2$, ZrXSi1-XO2, Zr—Si-oxynitride, and combinations thereof.

The metal layer of the gate electrode may have a workfunction of, for example, at least 4 eV. The metal layer may be one of titanium, titanium nitride, tantalum nitride, tantalum, tungsten, hafnium, niobium, molybdenum, ruthenium dioxide, molybdenum nitride, iridium, platinum, cobalt, chrome, ruthenium monoxide, titanium aluminide (Ti3Al), Ti2AlN, palladium, tungsten nitride (WNx), tungsten silicicide (WSi), nickel silicide, or combinations thereof.

In other example embodiments, the charge trap gate structure may be an ONO structure. In example embodiments, the ONO structure may include a first oxide layer, a nitride layer on the first oxide layer, and a second oxide layer on the nitride layer.

In other example embodiment as described above the gate structure may be a floating gate structure. Regarding gate structures, the contents of U.S. Pat. No. 6,858,906, U.S. Patent Application No. 2004/0169238, filed on Mar. 8, 2004, and U.S. Patent Application No. 2006/0180851, filed on Apr. 12, 2006 are incorporated by reference herein, in their entirety.

Figure 30:
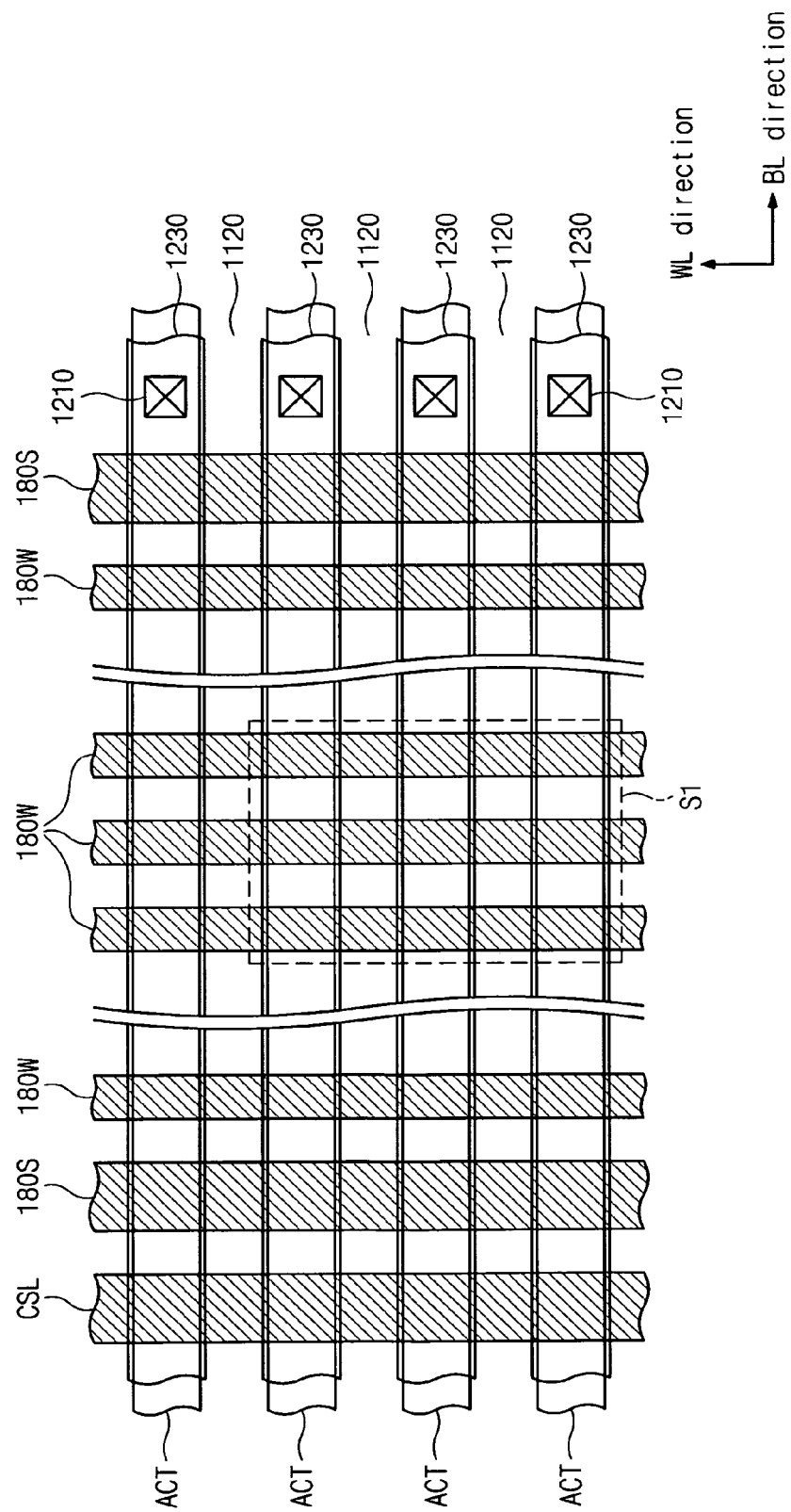
FIG. 30 illustrates a plan view of NAND flash memory cells in accordance with example embodiments.

FIG. 30 illustrates a plan view of NAND flash memory cells in accordance with example embodiments. As shown, NAND flash memory cells may include isolation regions 1120, select gates 1805, word lines (or gate patterns) 180W, bit line contacts 1210, bit lines 1230, a common source line CSL, and/or active regions ACT. Each of the NAND flash memory cells illustrated in FIG. 30 may be implemented as a nonvolatile memories 100, 200, 300, 400, 2400, 2500, 2600, and/or 2700 of any one of FIGS. 1-29.

Figure 31:
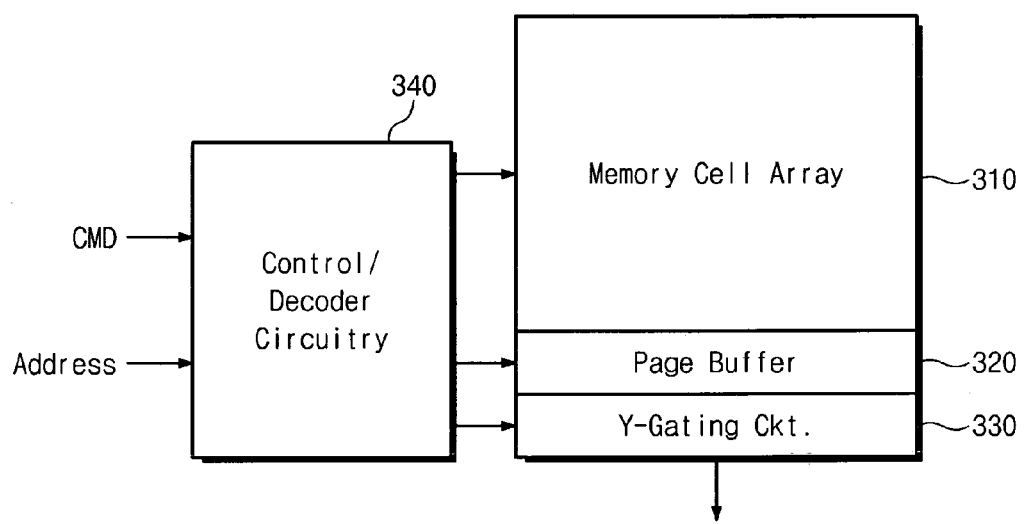
FIG. 31 illustrates a NAND flash memory in accordance with example embodiments.

FIG. 31 illustrates a NAND flash memory in accordance with example embodiments. As shown, the NAND flash memory may include a memory array 310 of memory cells to store data, a page buffer block 320, a Y-gating circuit 330 and/or control/decoder circuitry 340 for controlling the operation of the memory array 310, the page buffer block 320, and the Y-gating circuit 330. The control/decoder circuitry 340 may receive command signals and an address, and generates control signals for controlling the memory array 310, the page buffer block 320, and the Y-gating circuit 330.

Figure 32:
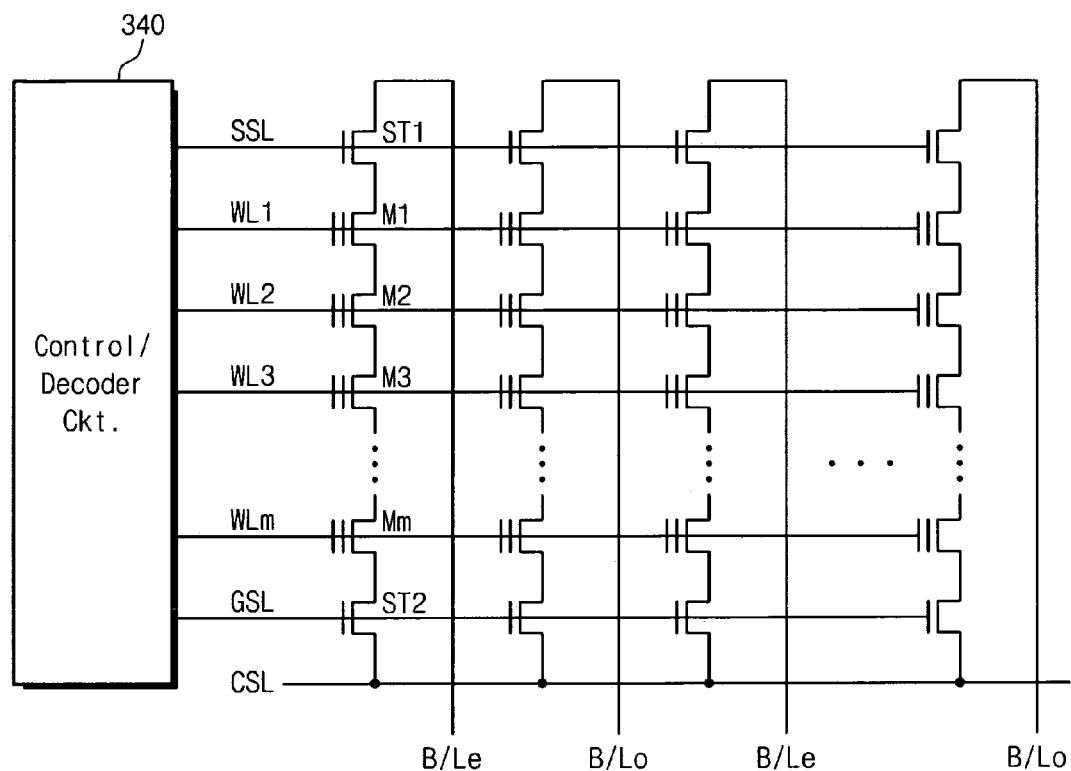
FIG. 32 illustrates an example of a portion of a memory array in accordance with example embodiments.

FIG. 32 illustrates an example of a portion of the memory array 310 in accordance with example embodiments. As shown, the memory array 310 may include a plurality of bit lines B/Le, B/Lo, where "e" and "o" designate even and odd bit lines. The memory cell array 310 may include a plurality of cell strings each respectively connected to one of bit lines B/Le and B/Lo. Each cell string in the illustrated example may be formed from a string selection transistor SST (for example, select transistors 1021, 1022 described above) connected to its corresponding bit line, a ground selection transistor GST (for example, select transistors 1021, 1022 described above) connected to a common source line CSL, and a plurality of memory cells M1-Mm (for example, unit transistors 1001 . . . 100N described above) connected in series between the string selection transistor SST and the ground selection transistor GST. Each string selection transistor SST, ground selection transistor GST, and memory cell M1-Mm may be formed according to one of the above described example embodiments. While not shown in FIG. 32, more than one string may be connected to a bit line. Each bit line may be connected to a respective page buffer in the page buffer block 320.

The page buffer block 320 may include a plurality of page buffers for reading and writing data into the memory array 310 based on the control signals from the control/decoder circuitry 340. The Y-gating circuit 330 may select page buffers in the page buffer block 320 for input of data or output of data based on the control signals from the control/decoder circuitry 340. Because the structure and operation of the page buffer block 320, the Y-gating circuit 330 and the control/decoder circuitry 340 are so well-known, the structure and operation of these elements will not be described in detail for the sake of brevity. Instead, U.S. Pat. No. 7,042,770 illustrating an example NAND flash memory, which may employ example embodiments, is hereby incorporated by reference in its entirety.

Furthermore, it will be appreciated that example embodiments are not limited in application to a NAND flash memory having the architecture described above with respect to FIGS. 30-32. Instead, example embodiments may be applied to the cell array of various NAND flash memory architectures.

Figure 33:
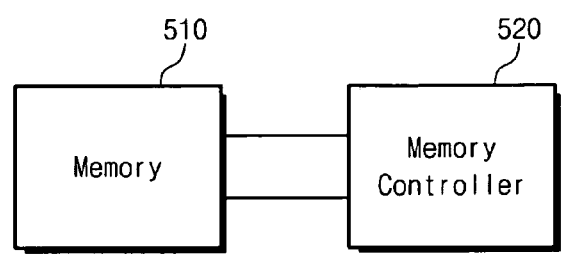
FIG. 33 illustrates another example embodiment including a memory controller in accordance with example embodiments.

FIG. 33 illustrates another example embodiment. As shown, FIG. 34 includes a memory 510 connected to a memory controller 520. The memory 510 may be the NAND flash memory discussed above. However, the memory 510 is not limited to these memory architectures, and may be any memory architecture having memory cells formed according to example embodiments.

The memory controller 520 may supply the input signals for controlling operation of the memory 510. For example, in the case of the NAND flash memory of FIGS. 31-32, the memory controller 520 may supply the command CMD and address signals. It will be appreciated that the memory controller 520 may control the memory 510 based on received control signals (not shown).

Figure 34:
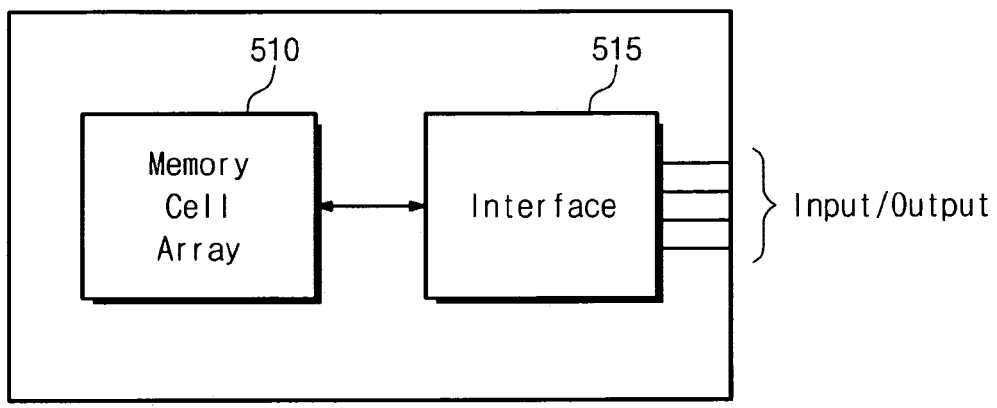
FIG. 34 illustrates another example embodiment including an interface in accordance with example embodiments.

FIG. 34 illustrates another example embodiment. As shown, FIG. 34 includes a memory 510 connected to an interface 515. The memory 510 may be the NAND flash memory discussed above. However, the memory 510 is not limited to these memory architectures, and may be any memory architecture having memory cells formed according to example embodiments.

The interface 515 may supply the input signals (for example, generated externally) for controlling operation of the memory 510. For example, in the case of the NAND flash memory of FIGS. 31-32, the interface 515 may supply the command CMD and address signals. It will be appreciated that the interface 515 may control the memory 510 based on received control signals (for example, generated externally, but not shown).

Figure 35:
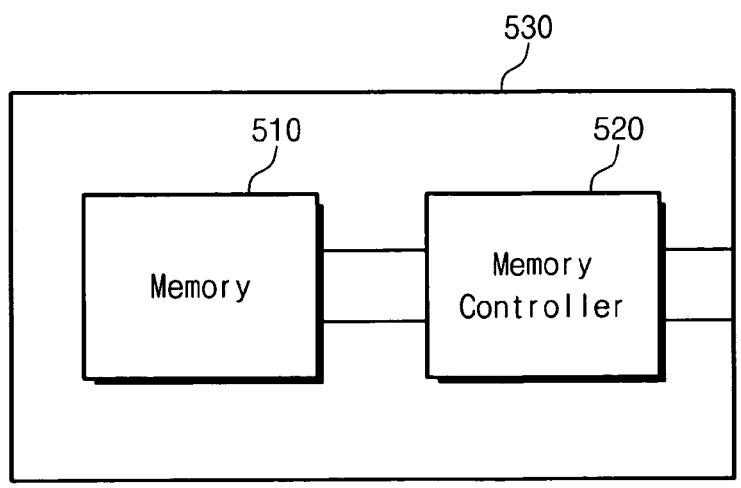
FIG. 35 illustrates an example memory card in accordance with example embodiments.

FIG. 35 illustrates another example embodiment. FIG. 35 is similar to FIG. 33, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 36:
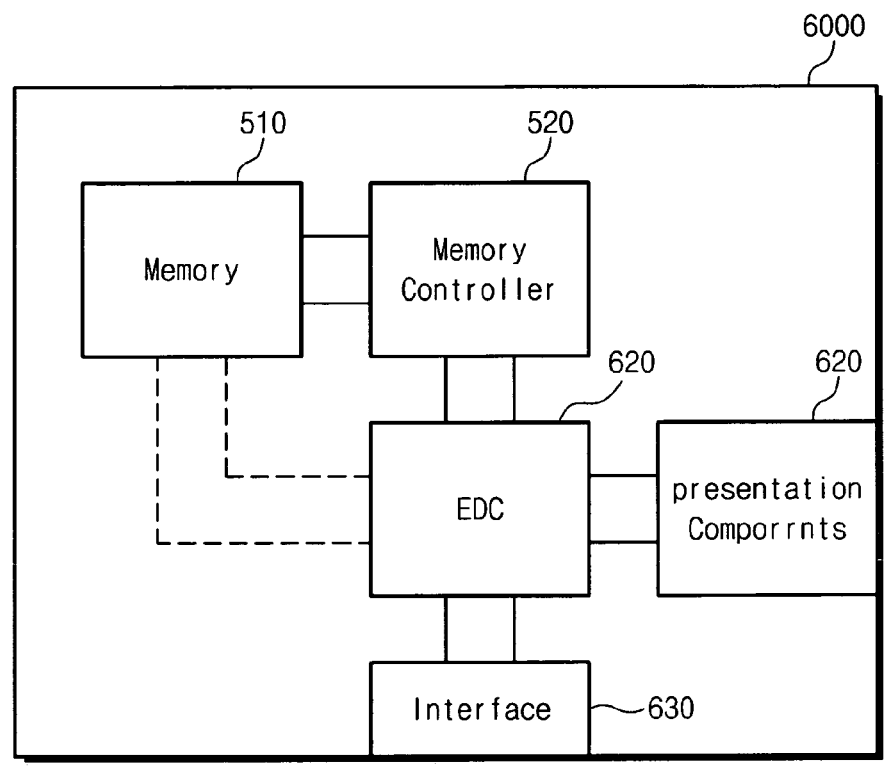
FIG. 36 illustrates an example portable device in accordance with example embodiments.

FIG. 36 illustrates another example embodiment. FIG. 36 represents a portable device 6000. The portable device 6000 may be an MP3 player, video player, combination video and audio player, etc. As shown, the portable device 6000 includes the memory 510 and memory controller 520. The portable device 6000 may also includes an encoder and decoder 610, presentation components 620 and interface 630.

Data (video, audio, etc.) may be input to and output from the memory 510 via the memory controller 520 by an encoder and decoder (EDC) 610. As shown by the dashed lines in FIG. 36, the data may be directly input to the memory 510 from the EDC 610 and/or directly output from the memory 510 to the EDC 610.

The EDC 610 may encode data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 37:
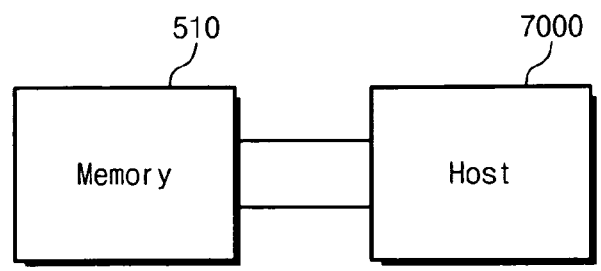
FIG. 37 illustrates an example host system in accordance with example embodiments.

FIG. 37 illustrates another example embodiment. As shown, the memory 510 may be connected with a host system 7000. The host system 7000 may be a processing system such as a personal computer, digital camera, etc. The host system 7000 may use the memory 510 as a removable storage medium. As will be appreciated, the host system 7000 supplies the input signals for controlling operation of the memory 510. For example, in the case of the NAND flash memory of FIGS. 31-32, the host system 7000 supplies the command CMD and address signals.

Figure 38:
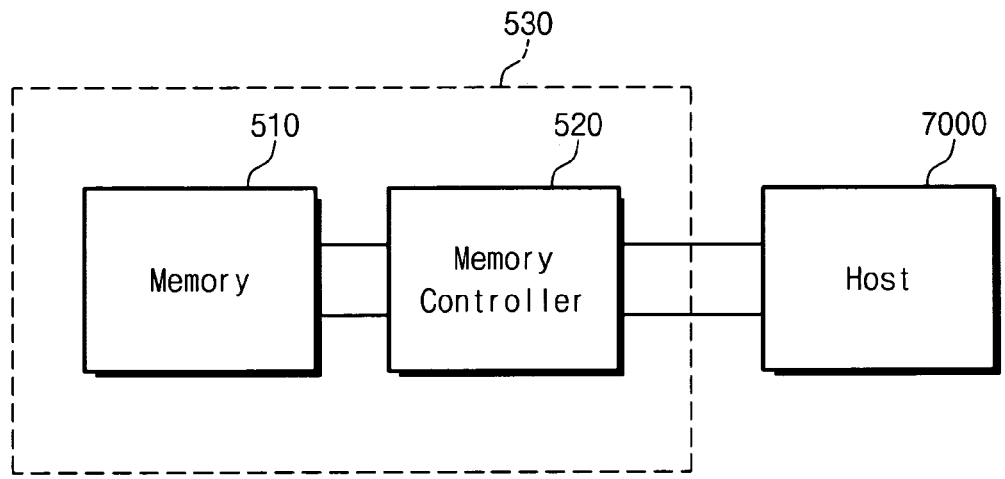
FIG. 38 illustrates an example memory card and host system in accordance with example embodiments.

FIG. 38 illustrates example embodiments in which the host system 7000 is connected to the card 530 of FIG. 35. In example embodiments, the host system 7000 may apply control signals to the card 530 such that the memory controller 520 controls operation of the memory 510.

Figure 39:
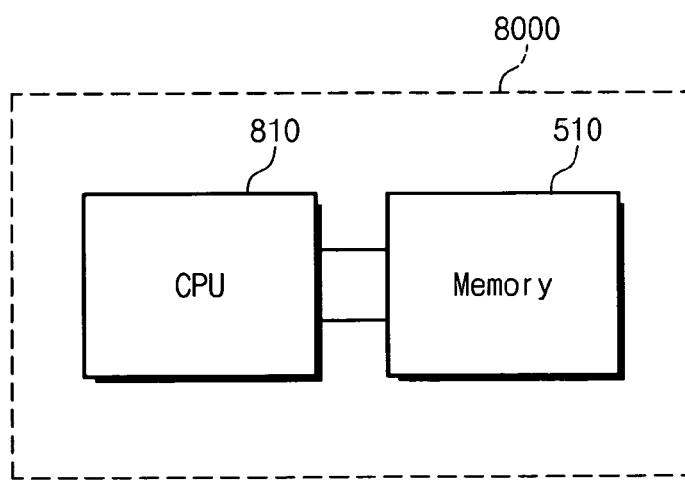
FIG. 39 illustrates an example computer system in accordance with example embodiments.

FIG. 39 illustrates other example embodiments. As shown, the memory 510 may be connected to a central processing unit (CPU) 810 within a computer system 8000. For example, the computer system 8000 may be a personal computer, personal data assistant, etc. The memory 510 may be directly connected with the CPU 810, connected via bus, etc. It will be appreciated, that FIG. 39 does not illustrate the full complement of components that may be included within a computer system 8000 for the sake of clarity.

Figure 40:
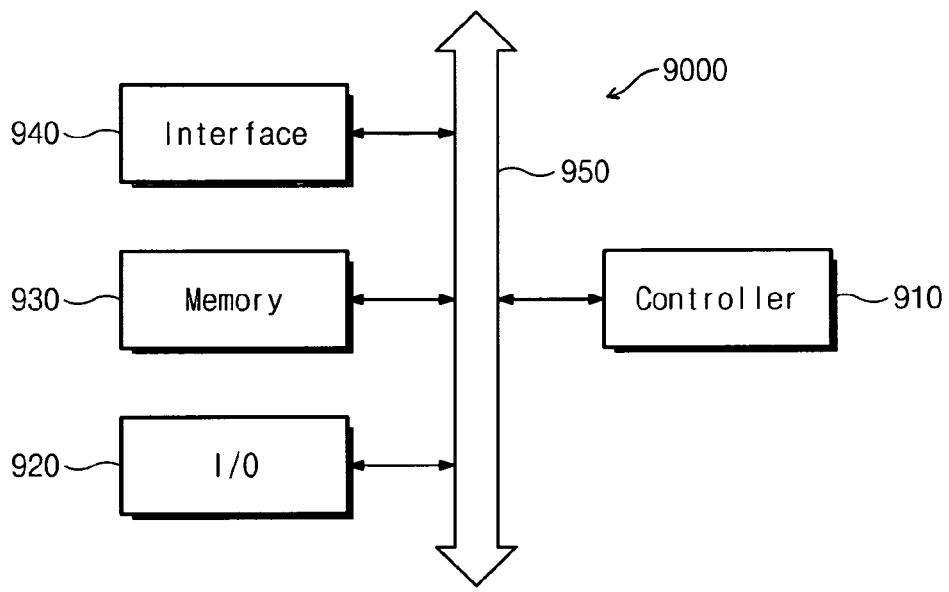
FIG. 40 illustrates an example system in accordance with example embodiments.
Figure 41:
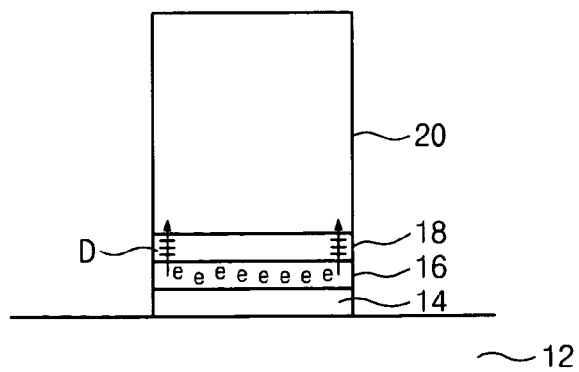
FIG. 41 illustrates a conventional charge trap memory device including a trap-assisted leakage current.
Figure 42:
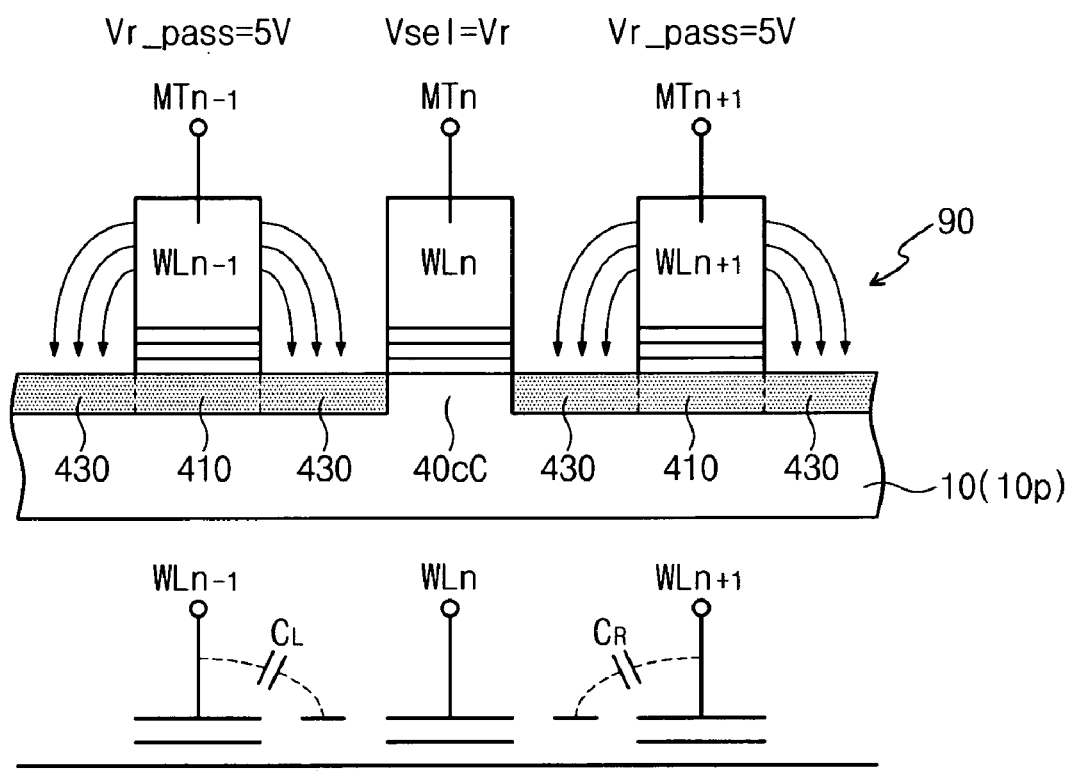
FIG. 42 illustrates a conventional memory device

FIG. 40 illustrates other example embodiments. As shown, system 900 may include a controller 910, an input/output device 920, for example, a keypad, a keyboard, and/or a display, a memory 930, and/or an interface 940. In example embodiments, each of the system elements may be combined each other through a bus 950.

The controller 910 may include one or more microprocessors, a digital signal processor, a microcontroller, or any processor similar to the above. The memory 930 may be used to store data and/or commands executed by the controller 910. The memory 930 may be any of any of the memories described in example embodiments above.

The interface 940 may be used to transmit data to and/or from another system, for example, a communication network. The system 900 may be part of a mobile system, such as a PDA, a portable computer, web tablet, a wireless phone, a mobile phone, a digital music player, memory card, or other system transmitting and/or receiving information.

Example embodiments being thus described, it will be obvious that the same may be varied in many ways. Such variations are not to be regarded as a departure from example embodiments, and all such modifications are intended to be included within the scope of append claims.

What is claimed:

1. A nonvolatile memory, comprising:
a substrate having a well region of a first type;
a plurality of memory transistors in series on the well region of the substrate, wherein source/drain and channel regions therebetween are of the first type; and
a select transistor, at each end of the plurality of memory transistors in series, wherein channel regions of each of the select transistors is of the first type, wherein the source/drain region between each of the select transistors and end transistors of the plurality of memory transistors in series is of the first type.

2. The nonvolatile memory of claim 1, wherein the first type is p-type.

3. The nonvolatile memory of claim 2, further comprising:
a first dummy select transistor at one end of the plurality of memory transistors in series between one of the select transistors and the plurality of memory transistors in series; and
a second dummy select transistor at the other end of the plurality of memory transistors in series between the other select transistor and the plurality of memory transistors in series.

4. The nonvolatile memory of claim 3, wherein the source/drain region between one of the select transistors and the first dummy select transistor and the source/drain region between the other select transistors and the second dummy select transistor is p-type.

5. The nonvolatile memory of claim 3, wherein the source/drain region between one of the select transistors and the first dummy select transistor and the source/drain region between the other select transistors and the second dummy select transistor is n-type.

6. A method of manufacturing a nonvolatile memory, comprising:
providing a substrate having a well region of a first type;
forming source/drain and channel regions of a plurality of memory transistors in series on the well region of the substrate, of the first type;
forming channel regions of a select transistor at each end of the plurality of memory transistors in series, of the first type, and
forming the source/drain region between each of the select transistors and end transistors of the plurality of memory transistors in series of the first type.

7. The method of claim 6, wherein the first type is p-type.

8. The method of claim 7, further comprising:
forming a first dummy select transistor at one end of the plurality of memory transistors in series between one of the select transistors and the plurality of memory transistors in series; and forming a second dummy select transistor at the other end of the plurality of memory transistors in series between the other select transistor and the plurality of memory transistors in series.

9. The method of claim 8, further comprising:
forming the source/drain region between one of the select transistors and the first dummy select transistor and the source/drain region between the other select transistors and the second dummy select transistor of p-type.

10. The method of claim 8, further comprising:
forming the source/drain region between one of the select transistors and the first dummy select transistor and the source/drain region between the other select transistors and the second dummy select transistor of n-type.

11. The nonvolatile memory of claim 1, wherein a stacking structure of the select transistors is different than a stacking structure of the plurality of the memory transistors.

12. The method of claim 6, wherein a stacking structure of the select transistors is different than a stacking structure of the plurality of the memory transistors.

13. The nonvolatile memory of claim 1, wherein a dopant concentration of at least one of the source/drain and channel regions of the plurality of memory transistors is lower than a dopant concentration of the channel regions of at least one of the select transistors.

14. The method of claim 6, wherein a dopant concentration of at least one of the source/drain and channel regions of the plurality of memory transistors is lower than a dopant concentration of the channel regions of at least one of the select transistors.

15. The nonvolatile memory of claim 3, wherein a source/drain region of one of the first and second dummy select transistors includes a different doping concentration than a doping concentration of the channel regions of at least one of the select transistors.

16. The method of claim 8, wherein a source/drain region of one of the first and second dummy select transistors includes a different doping concentration than a doping concentration of the channel regions of at least one of the select transistors.

17. The nonvolatile memory of claim 3, wherein a channel of at least one of the first and second dummy select transistors is of the first type.

18. The method of claim 8, wherein a channel of at least one of the first and second dummy select transistors is of the first type.

19. A nonvolatile memory, comprising:
a plurality of memory transistors in series, wherein source/drain and channel regions therebetween are of a first type; and
a select transistor at each end of the plurality of memory transistors in series, wherein channel regions of each of the select transistors is of the first type,
wherein a doping concentration of the source/drain regions between the plurality of memory transistors in series is less than a doping concentration of the channel regions of the plurality of memory transistors and the source/drain region between each of the select transistors and end transistors of the plurality of memory transistors in series is of the first type.

20. The nonvolatile memory device of claim 19, wherein the plurality of memory transistors and the select transistors are disposed on a well region of the substrate, and the well region is of the first type.

* * * * *